US012484358B2

(12) United States Patent
Lee et al.

(10) Patent No.: US 12,484,358 B2
(45) Date of Patent: Nov. 25, 2025

(54) DISPLAY DEVICE

(71) Applicant: SAMSUNG DISPLAY CO., LTD., Yongin-si (KR)

(72) Inventors: Sang Hoon Lee, Yongin-si (KR); Ki Nyeng Kang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 460 days.

(21) Appl. No.: 17/998,650

(22) PCT Filed: Jun. 23, 2020

(86) PCT No.: PCT/KR2020/008199
§ 371 (c)(1),
(2) Date: Nov. 11, 2022

(87) PCT Pub. No.: WO2021/230418
PCT Pub. Date: Nov. 18, 2021

(65) Prior Publication Data
US 2023/0352644 A1 Nov. 2, 2023

(30) Foreign Application Priority Data
May 14, 2020 (KR) .................. 10-2020-0057855

(51) Int. Cl.
H10H 20/857 (2025.01)
H01L 25/16 (2023.01)
(52) U.S. Cl.
CPC ......... H10H 20/857 (2025.01); H01L 25/167 (2013.01)

(58) Field of Classification Search
CPC .... H10H 20/857; H10H 20/84; H10H 29/142; H10H 20/82; H10H 20/882; H01L 25/167; H01L 25/0753
See application file for complete search history.

(56) References Cited

U.S. PATENT DOCUMENTS 7,667,224 B2  2/2010  Ohashi et al.
8,643,040 B2  2/2014  Lee et al.
(Continued)

FOREIGN PATENT DOCUMENTS

JP  2006-253298 A  9/2006
JP  2015-032809 A  2/2015
(Continued)

OTHER PUBLICATIONS

International Search Report of PCT/KR2020/008199, Feb. 9, 2021, 5 pp.

Primary Examiner — Victor A Mandala
(74) Attorney, Agent, or Firm — Womble Bond Dickinson (US) LLP

(57) ABSTRACT

A includes a substrate, a first electrode and a second electrode on the substrate and spaced from each other, a light emitting element between the first electrode and the second electrode, an insulating pattern on the light emitting element, a first contact electrode on one side of the insulating pattern and contacting the first electrode and one end of the light emitting element, and a second contact electrode on another side of the insulating pattern and contacting the second electrode and an other end of the light emitting element, and a surface of the insulating pattern includes a concave-convex pattern.

19 Claims, 18 Drawing Sheets

(56) References Cited

U.S. PATENT DOCUMENTS

| | | | |
|---|---|---|---|
| 9,287,464 B2 | 3/2016 | Saito et al. | |
| 10,026,777 B2* | 7/2018 | Kang | H01L 25/0753 |
| 11,335,838 B2* | 5/2022 | Choi | H10H 20/831 |
| 12,155,022 B2* | 11/2024 | Do | H01L 24/95 |
| 2014/0145218 A1 | 5/2014 | Kim et al. | |
| 2014/0146547 A1 | 5/2014 | Tsutsumi et al. | |
| 2018/0175104 A1* | 6/2018 | Kang | H10H 29/10 |
| 2019/0305035 A1* | 10/2019 | Cho | H10H 20/8252 |
| 2021/0134768 A1 | 5/2021 | Lee et al. | |
| 2021/0167253 A1 | 6/2021 | Basrur et al. | |
| 2021/0351171 A1 | 11/2021 | Yoo et al. | |
| 2022/0069187 A1* | 3/2022 | Akimoto | H10H 20/825 |
| 2022/0102604 A1* | 3/2022 | Do | H10H 20/857 |
| 2022/0223575 A1* | 7/2022 | Kim | H10H 20/855 |
| 2023/0282777 A1* | 9/2023 | Moon | H10H 20/857 |
| | | | 257/79 |

FOREIGN PATENT DOCUMENTS

| | | |
|---|---|---|
| KR | 10-1039610 B1 | 6/2011 |
| KR | 10-2018-0071465 A | 6/2018 |
| KR | 10-2020-0034904 A | 4/2020 |
| KR | 10-2021-0053391 A | 5/2021 |

* cited by examiner

DISPLAY DEVICE

CROSS-REFERENCE TO RELATED APPLICATIONS

This application is a U.S. National Phase Patent Application of International Patent Application Number PCT/KR2020/008199, filed on Jun. 23, 2020, which claims priority to Korean Patent Application Number 10-2020-0057855, filed on May 14, 2020, the entire contents of all of which are incorporated by reference herein.

BACKGROUND

1. Field

Aspects of embodiments of the present disclosure relate to a display device.

2. Description of the Related Art

In recent years, interest in information display is being increased. Accordingly, research and development on the display device is being continuously conducted.

SUMMARY

An aspect of embodiments of the present disclosure is to provide a display device capable of simplifying a manufacturing process.

Aspects of the present disclosure are not limited to the aspect described above, and other aspects that are not described will be clearly understood by those skilled in the art from the following description.

According to one or more embodiments of the present disclosure, a display device includes a substrate, a first electrode and a second electrode on the substrate and spaced from each other, a light emitting element between the first electrode and the second electrode, an insulating pattern on the light emitting element, a first contact electrode on one side of the insulating pattern and contacting the first electrode and one end of the light emitting element, and a second contact electrode on another side of the insulating pattern and contacting the second electrode and the an other end of the light emitting element, and a surface of the insulating pattern includes a concave-convex pattern.

The first contact electrode and the second contact electrode may include same material.

The insulating pattern may expose the one end of the light emitting element and the other end of the light emitting element.

The first contact electrode and the second contact electrode may be spaced from each other with the insulating pattern interposed therebetween.

The display device may further include an insulating layer covering the first contact electrode and the second contact electrode.

The insulating layer may cover the concave-convex pattern.

The concave-convex pattern may have a plurality of protrusion portions and depression portions.

The display device may further include a conductive material layer in the depression portion.

The conductive material layer may include same material as the first contact electrode and the second contact electrode.

A thickness of the conductive material layer may be less than a thickness of the protrusion portion.

A surface roughness of a side surface of the insulating pattern may be greater than a surface roughness of an upper surface of the insulating pattern.

The display device may further include a conductive pattern on the upper surface of the insulating pattern.

The conductive pattern may be located between the first contact electrode and the second contact electrode.

The conductive pattern may be electrically separated from the first contact electrode and the second contact electrode.

The conductive pattern may include same material as the first contact electrode and the second contact electrode.

A thickness of the conductive pattern may be substantially same as a thickness of the first contact electrode and the second contact electrode.

The display device may further include an insulating layer on the first contact electrode and the second contact electrode.

The insulating layer may cover the side surface of the insulating pattern.

The insulating layer may be not in-contact with the upper surface of the insulating pattern.

The conductive pattern is between the upper surface of the insulating pattern and the insulating layer.

The details of other embodiments are included in the detailed description and drawings.

According to one or more embodiments of the present disclosure, because the insulating pattern includes the concave-convex pattern, the first contact electrode and the second contact electrode may be prevented from being short-circuited, and thus, process economics may be improved by concurrently forming (e.g., simultaneously forming) the first contact electrode and the second contact electrode.

Aspects and features of embodiments of the present disclosure are not limited by the above disclosure, and more various aspects and features are included in the present specification.

DETAILED DESCRIPTION

Figure 1:
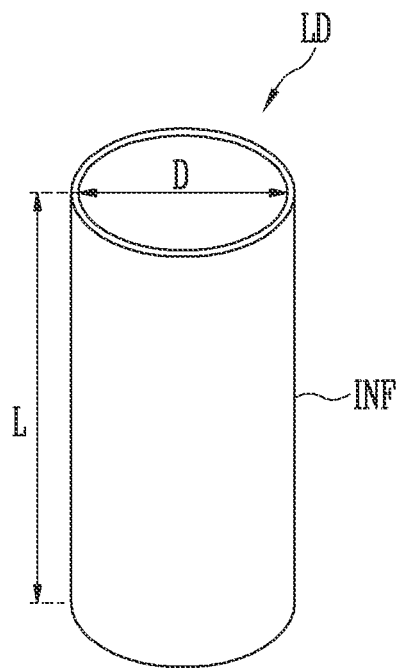
FIGS. 1 and 2 are perspective and cross-sectional views illustrating a light emitting element according to one or more embodiments.

Aspects and features of embodiments of the present disclosure and a method of achieving them will become apparent with reference to embodiments described in detail below together with the accompanying drawings. However, the present disclosure is not limited to the embodiments disclosed below and may be implemented in various different forms. The present disclosure is defined by the scope of the claims and their equivalents.

A case in which an element or a layer is referred to as "on" another element or layer includes a case in which another layer or another element is disposed directly on the other element or between the other layers. The same reference numeral refers to the same reference component throughout the specification.

Although a first, a second, and the like are used to describe various components, these components are not limited by these terms. These terms are used only to distinguish one component from another component. Therefore, a first component described below may be a second component within the technical spirit. The singular expression includes a plural expression unless the context clearly dictates otherwise.

Hereinafter, embodiments will be described in detail with reference to the accompanying drawings.

Figure 2:
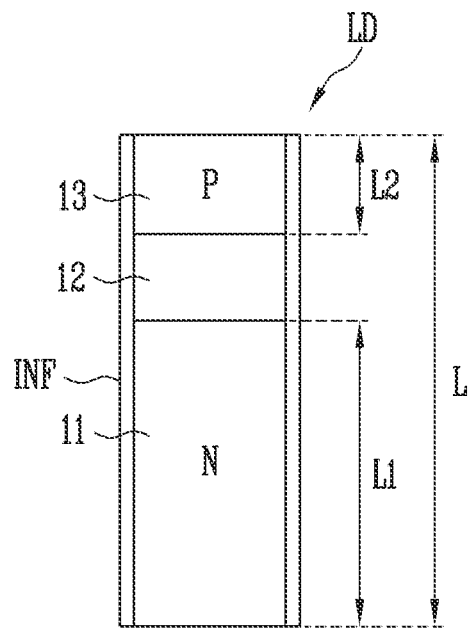

FIGS. 1 and 2 are perspective and cross-sectional views illustrating a light emitting element according to one or more embodiments. Although a rod shape light emitting element LD of a cylindrical shape is shown in FIGS. 1 and 2, a type and/or a shape of the light emitting element LD is not limited thereto.

Referring to FIGS. 1 and 2, the light emitting element LD may include a first semiconductor layer 11, a second semiconductor layer 13, and an active layer 12 interposed between the first and second semiconductor layers 11 and 13. For example, the light emitting element LD may be configured as a stack in which the first semiconductor layer 11, the active layer 12, and the second semiconductor layer 13 are sequentially stacked along one direction.

According to one or more embodiments, the light emitting element LD may be provided in a rod shape extending along one direction. The light emitting element LD may have one side end and another side end along the one direction.

According to one or more embodiments, one of the first and second semiconductor layers 11 and 13 may be disposed at the one side end of the light emitting element LD, and the other one of the first and second semiconductor layers 11 and 13 may be disposed at the other side end of the light emitting element LD.

According to one or more embodiments, the light emitting element LD may be a rod shape light emitting diode manufactured in a rod shape. Here, the rod shape encompasses a rod-like shape or a bar-like shape that is longer in a longitudinal direction than a width direction (that is, having an aspect ratio greater than 1), such as a cylinder or polygonal column, and the shape of a cross-section thereof is not particularly limited. For example, a length L of the light emitting element LD may be greater than a diameter D (or a width of the cross-section) thereof.

According to one or more embodiments, the light emitting element LD may have a size as small as a nano scale to a micro scale (e.g., nanometer scale to micrometer scale), for example, the diameter D and/or the length L of a range of about 100 nm to about 10 um. However, the size of the light emitting element LD is not limited thereto. For example, the size of the light emitting element LD may be variously changed according to a design condition of various devices using the light emitting element LD as a light source, for example, a display device or the like.

The first semiconductor layer 11 may include at least one n-type semiconductor material. For example, the first semiconductor layer 11 may include one semiconductor material from among InAlGaN, GaN, AlGaN, InGaN, AlN, and InN, and may include an n-type semiconductor material doped with a first conductive dopant such as Si, Ge, or Sn, but is not limited thereto.

The active layer 12 may be disposed on the first semiconductor layer 11 and may be formed in a single or multiple quantum well structure. In one or more embodiments, a clad layer doped with a conductive dopant may be formed on and/or under of the active layer 12. For example, the clad layer may be formed of an AlGaN or an InAlGaN. According to one or more embodiments, a material of AlGaN, InAlGaN, or the like may be used to form the active layer 12, and various materials other than the material described above may configure the active layer 12. The active layer 12 may be disposed between the first semiconductor layer 11 and the second semiconductor layer 13 that will be described later.

When a voltage greater than or equal to a threshold voltage is applied to both ends (e.g., opposite ends) of the light emitting element LD, the light emitting element LD may emit light while electron-hole pairs are combined in the active layer 12. By controlling light emission of the light emitting element LD using this principle, the light emitting element LD may be used as a light source of various light emitting elements including a pixel of a display device.

The second semiconductor layer 13 may be disposed on the active layer 12 and may include a semiconductor material of a type different from that of the first semiconductor layer 11. For example, the second semiconductor layer 13 may include at least one p-type semiconductor material. For example, the second semiconductor layer 13 may include at least one semiconductor material from among InAlGaN, GaN, AlGaN, InGaN, AlN, and InN, and may include a p-type semiconductor material doped with a second conductive dopant such as Mg. However, the material configuring the second semiconductor layer 13 is not limited thereto, and various materials other than the material described above may configure the second semiconductor layer 13. According to one or more embodiments, a first length L1 of the first semiconductor layer 11 may be longer than a second length L2 of the second semiconductor layer 13.

In one or more embodiments, when the light emitting element LD including the active layer 12 and the semiconductor layers 11 and 13, includes nitrogen (N), the light emitting element LD may emit blue light of which a central wavelength band has a range of 400 nm to 500 nm or green light of which a central wavelength band has a range of 500 nm to 570 nm. However, it should be understood that the central wavelength band of the blue light and the green light is not limited to the above-described range and includes all wavelength ranges that may be recognized as blue or green in the present technical field.

According to one or more embodiments, the light emitting element LD may further include an insulating film INF provided on a surface (e.g., an outer peripheral or circumferential surface). The insulating film INF may be formed on the surface (e.g., an outer peripheral or circumferential surface) of the light emitting element LD to be around (e.g., to surround) at least an outer surface (e.g., an outer peripheral or outer circumferential surface) of the active layer 12, and may further be around (e.g., surround) one area of the first and second semiconductor layers 11 and 13.

According to one or more embodiments, the insulating film INF may expose the both ends of the light emitting element LD having different polarities. For example, the insulating film INF may not cover and may expose one ends of each of the first and second semiconductor layers 11 and 13 positioned at the both ends of the light emitting element LD on the longitudinal direction, for example, two planes (that is, an upper surface and a lower surface) of a cylinder. In one or more embodiments, the insulating film INF may expose the both ends of the light emitting element LD having different polarities and sides of the semiconductor layers 11 and 13 adjacent to the both ends.

According to one or more embodiments, the insulating film INF be configured as a single layer or multiple layers by including at least one insulating material from among silicon dioxide ($SiO_2$), silicon nitride ($Si_3N_4$), aluminum oxide ($Al_2O_3$), and titanium dioxide ($TiO_2$) (for example, double layers configured of aluminum oxide ($Al_2O_3$) and silicon dioxide ($SiO_2$) but is not necessarily limited thereto.

In one or more embodiments, the light emitting element LD may further include an additional component in addition to the first semiconductor layer 11, the active layer 12, the second semiconductor layer 13, and/or the insulating film INF. For example, the light emitting element LD may additionally include one or more phosphor layers, active layers, semiconductor materials and/or electrode layers disposed on one end side of the first semiconductor layer 11, the active layer 12, and/or the second semiconductor layer 13.

Figure 3:
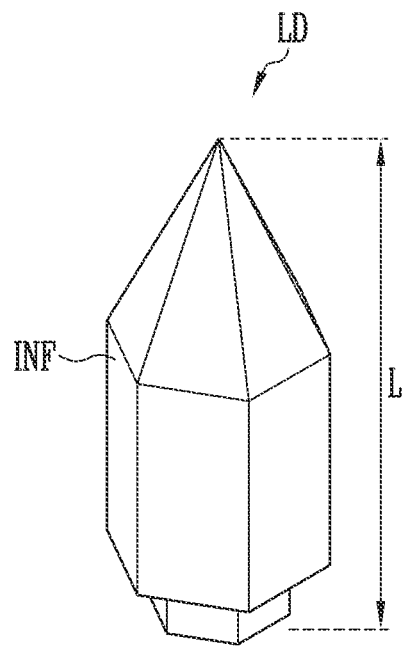
FIGS. 3 and 4 are perspective and cross-sectional views illustrating a light emitting element according to one or more embodiments.
Figure 4:
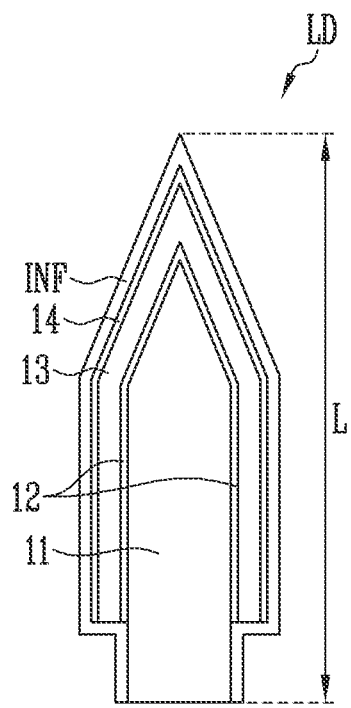

FIGS. 3 and 4 are perspective and cross-sectional views illustrating a light emitting element according to one or more embodiments.

Referring to FIGS. 3 and 4, the light emitting element LD according to one or more embodiments may include a first semiconductor layer 11, a second semiconductor layer 13, and an active layer 12 interposed between the first and second semiconductor layers 11 and 13. According to one or more embodiments, the first semiconductor layer 11 may be disposed in a center area (e.g., core) of the light emitting element LD, and the active layer 12 may be disposed on a surface (e.g., an outer peripheral or circumferential surface) of the first semiconductor layer 11 to be around (e.g., to surround) at least one area of the first semiconductor layer 11. The second semiconductor layer 13 may be disposed on a surface (e.g., an outer peripheral or circumferential surface) of the active layer 12 to be around (e.g., to surround) at least one area of the active layer 12.

In addition, the light emitting element LD may further include an electrode layer 14 and/or an insulating film INF around (e.g., surrounding) at least one area of the second semiconductor layer 13. For example, the light emitting element LD may include the electrode layer 14 disposed on a surface (e.g., an outer peripheral or circumferential surface) of the second semiconductor layer 13 to be around (e.g., to surround) one area of the second semiconductor layer 13, and the insulating film INF disposed on a surface (e.g., an outer peripheral or circumferential surface) of the electrode layer 14 to be around (e.g., to surround) at least one area of the electrode layer 14. That is, the light emitting element LD according to the above-described embodiment may be implemented as a core-shell structure including the first semiconductor layer 11, the active layer 12, the second semiconductor layer 13, the electrode layer 14, and the insulating film INF sequentially disposed in an outer direction from a center, and the electrode layer 14 and/or the insulating film INF may be omitted according to one or more embodiments.

In one or more embodiments, the light emitting element LD may be provided in a polygonal horn shape extending along any one direction. For example, at least one area of the light emitting element LD may have a hexagonal horn shape. However, a shape of the light emitting element LD is not limited thereto and may be variously changed.

When an extension direction of the light emitting element LD is referred to as a length L direction, the light emitting element LD may have one side end and another side end along the length L direction. According to one or more embodiments, one of the first and second semiconductor layers 11 and 13 may be disposed at the one side end of the light emitting element LD, and the other one of the first and second semiconductor layers 11 and 13 may be disposed at the other side end of the light emitting element LD.

In one or more embodiments, the light emitting element LD may be an ultra-small light emitting diode of a core-shell structure manufactured in a polygonal column shape, for example, a hexagonal horn shape of which both ends are protruded. For example, the light emitting element LD may have a size as small as a nano scale to a micro scale, for example, a width and/or a length L of a range of a nano scale or a micro scale, respectively. However, a size, a shape, and/or the like of the light emitting element LD may be variously changed according to a design condition of various devices using the light emitting element as a light source, for example, a display device or the like.

In one or more embodiments, both ends of the first semiconductor layer 11 may have a protruding shape along the length L direction of the light emitting element LD. Shapes of the both ends (e.g., the opposite ends) of the first semiconductor layer 11 may be different from each other. For example, one end disposed on an upper side of the both ends of the first semiconductor layer 11 may have a horn shape contacting one vertex as a width narrows toward an upper portion. In addition, another end of the first semiconductor layer 11 disposed on a lower side of the both ends of the first semiconductor layer 11 may have a polygonal column shape having a constant width, but is not limited thereto. For example, in one or more embodiments, the first semiconductor layer 11 may have a cross-section of a polygonal shape, a step shape, or the like in which the width is gradually narrowed toward a lower portion. The shape of the both ends of the first semiconductor layer 11 may be variously changed according to one or more embodiments and is not limited to the above-described embodiment.

According to one or more embodiments, the first semiconductor layer 11 may be positioned at a core, that is, a center (or a center area) of the light emitting element LD. In addition, the light emitting element LD may be provided in a shape corresponding to the shape of the first semiconductor layer 11. For example, when the first semiconductor layer 11 has a hexagonal horn shape, the light emitting element LD may have a hexagonal horn shape.

Figure 5:
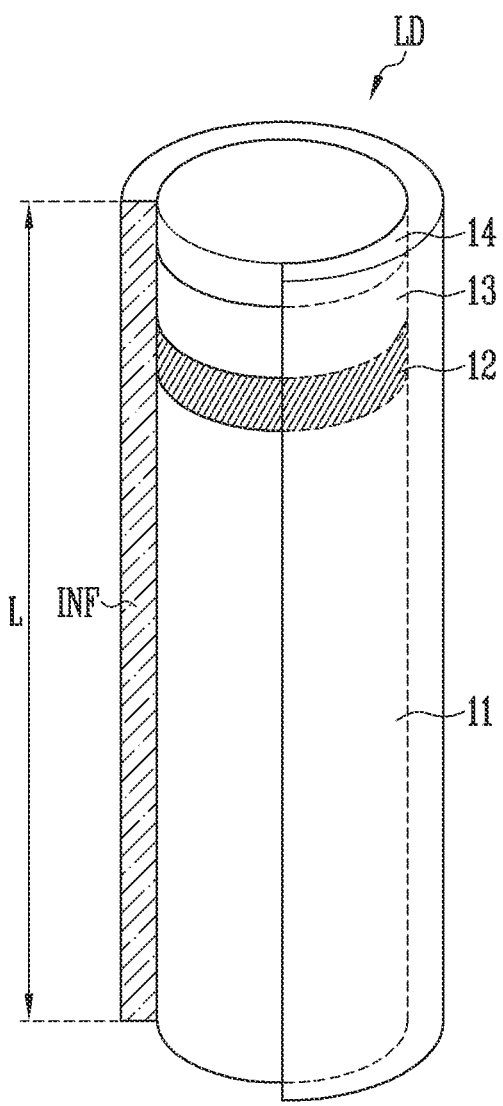
FIG. 5 is a perspective cutaway view illustrating a light emitting element according to one or more embodiments.

FIG. 5 is a perspective view illustrating a light emitting element according to one or more embodiments. In FIG. 5, a portion of the insulating film INF is omitted for convenience of description.

Referring to FIG. 5, the light emitting element LD may further include an electrode layer 14 disposed on the second semiconductor layer 13. The electrode layer 14 may be an ohmic contact electrode electrically connected to the second semiconductor layer 13 but is not necessarily limited thereto. According to one or more embodiments, the electrode layer 14 may be a Schottky contact electrode. The electrode layer 14 may include a metal or a metal oxide, and for example, Cr, Ti, Al, Au, Ni, ITO, IZO, ITZO, and an oxide or an alloy thereof may be used alone or in combination. In addition, the electrode layer 14 may be substantially transparent or translucent. Therefore, light generated in the active layer 12 of the light emitting element LD may pass through the electrode layer 14 and may be emitted to the outside of the light emitting element LD. In one or more embodiments, the light emitting element LD may further include an electrode layer disposed on the first semiconductor layer 11.

Figure 6:
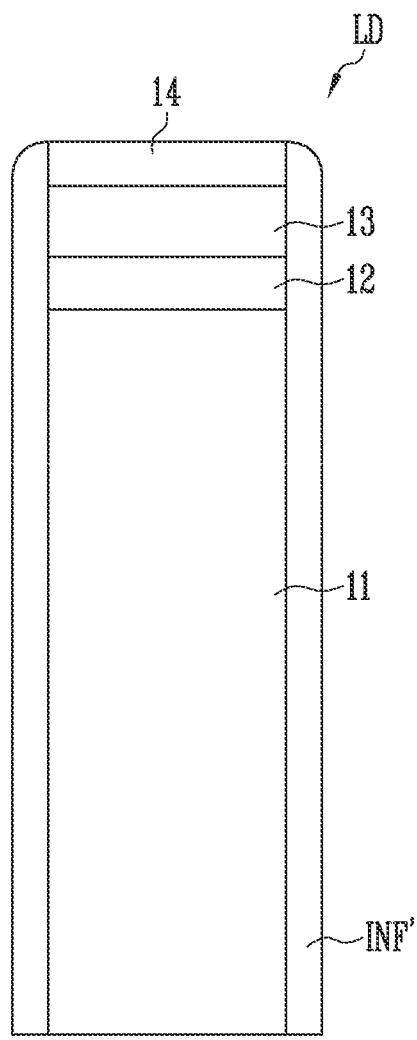
FIG. 6 is a cross-sectional view illustrating a light emitting element according to one or more embodiments.

FIG. 6 is a cross-sectional view illustrating a light emitting element according to one or more embodiments.

Referring to FIG. 6, an insulating film INF' may have a curved shape in a corner area adjacent to the electrode layer 14. According to one or more embodiments, the curved surface may be formed by etching in a manufacturing process of the light emitting element LD.

In one or more embodiments, in the light emitting element LD that includes an electrode layer disposed on the above-described first semiconductor layer 11, the insulating film INF' may have a curved shape in an area adjacent to the electrode layer.

Figure 7:
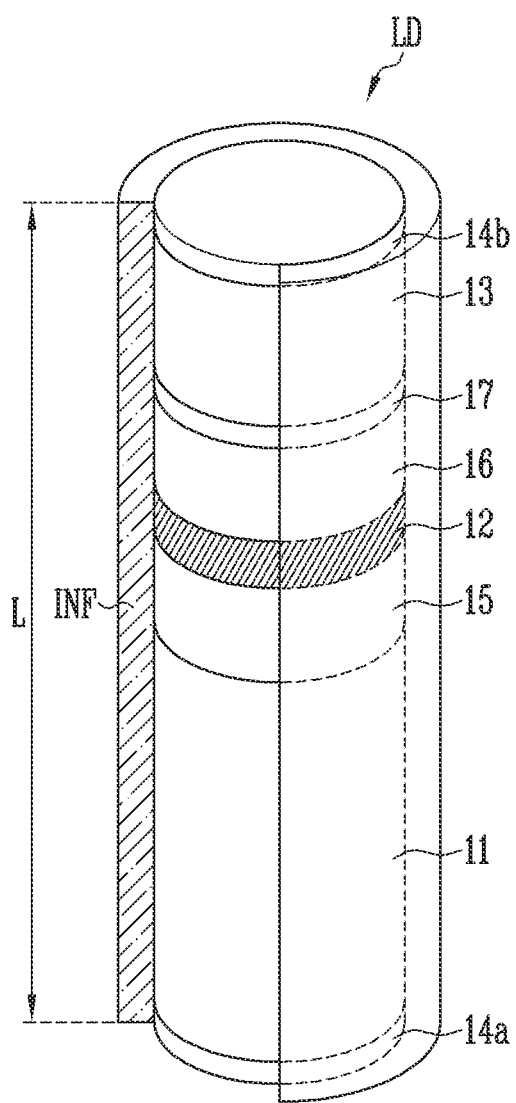
FIG. 7 is a perspective cutaway view illustrating a light emitting element according to one or more embodiments.

FIG. 7 is a perspective cutaway view illustrating a light emitting element according to one or more embodiments. In FIG. 7, a portion of the insulating film INF is omitted for convenience of description.

Referring to FIG. 7, the light emitting element LD may further include a third semiconductor layer 15 disposed between the first semiconductor layer 11 and the active layer 12. The light emitting element LD may also include a fourth semiconductor layer 16 and a fifth semiconductor layer 17 disposed between the active layer 12 and the second semiconductor layers 13. The light emitting element LD of FIG. 7 is different from the embodiment of FIG. 1, in that the plurality of semiconductor layers 15, 16, and 17 and electrode layers 14a and 14b are further disposed, and the active layer 12 includes another element. In addition, because a disposition and a structure of the insulating film INF are substantially the same as those of FIG. 1, repeated description of the same or substantially similar elements and features omitted while differences therebetween are primarily described.

In the light emitting element LD of FIG. 7, each of the active layer 12 and the other semiconductor layers 11, 13, 15, 16, and 17 may be a semiconductor including at least phosphorus (P). That is, the light emitting element LD according to one or more embodiments may emit red light of which a center wavelength band has a range of 620 nm to 750 nm. However, it should be understood that the center wavelength band of the red light is not limited to the above-described range and includes all wavelength ranges that may be recognized as red in the present technical field.

Specifically, the first semiconductor layer 11 may include at least any one or more of InAlGaP, GaP, AlGaP, InGaP, AlP, and InP doped with an n-type dopant when the light emitting element LD emits red light. The first semiconductor layer 11 may be doped with an n-type dopant, and for example, the n-type dopant may be Si, Ge, Sn, or the like. In one or more embodiments, the first semiconductor layer 11 may be n-AlGaInP doped with n-type Si. A length of the first semiconductor layer 11 may have a range of 1.5 µm to 5 µm but is not necessarily limited thereto.

The second semiconductor layer 13 may be any one or more of InAlGaP, GaP, AlGaNP, InGaP, AlP, and InP doped with a p-type dopant when the light emitting element LD emits red light. The second semiconductor layer 13 may be doped with a p-type dopant, and for example, the p-type dopant may be Mg, Zn, Ca, Se, Ba, or the like. In one or more embodiments, the second semiconductor layer 13 may be p-GaP doped with p-type Mg. A length of the second semiconductor layer 13 may have a range of 0.08 µm to 0.25 µm but is not necessarily limited thereto.

The active layer 12 may be disposed between the first semiconductor layer 11 and the second semiconductor layer 13. Similar to the active layer 12 of FIG. 1, the active layer 12 of FIG. 7 may also emit light of a specific wavelength band by including a single or multiple quantum well structure material. For example, when the active layer 12 emits light of a red wavelength band, the active layer 12 may include a material of AlGaP, AlInGaP, or the like. In particular, when the active layer 12 has a structure in which a quantum layer and a well layer are alternately stacked in a multiple quantum well structure, the quantum layer may include a material such as AlGaP or AlInGaP, and the well layer may include a material such as GaP or AlInP. In one or more embodiments, the active layer 12 may emit red light having a center wavelength band of 620 nm to 750 nm by including AlGaInP as the quantum layer and AlInP as the well layer.

The light emitting element LD of FIG. 7 may include a clad layer disposed adjacent to the active layer 12. As shown in the drawing, the third semiconductor layer 15 and the fourth semiconductor layer 16 disposed between the first semiconductor layer 11 and the second semiconductor layer 13 under and over the active layer 12 may be clad layers.

The third semiconductor layer 15 may be disposed between the first semiconductor layer 11 and the active layer 12. The third semiconductor layer 15 may be an n-type semiconductor similar to the first semiconductor layer 11, and for example, the first semiconductor layer 11 may be n-AlGaInP, and the third semiconductor layer 15 may be n-AlInP but are not necessarily limited thereto.

The fourth semiconductor layer 16 may be disposed between the active layer 12 and the second semiconductor layer 13. The fourth semiconductor layer 16 may be an n-type semiconductor similar to the second semiconductor layer 13, and for example, the second semiconductor layer 13 may be p-GaP, and the fourth semiconductor layer 16 may be p-AlInP.

The fifth semiconductor layer 17 may be disposed between the fourth semiconductor layer 16 and the second semiconductor layer 13. The fifth semiconductor layer 17 may be a p-doped semiconductor similar to the second semiconductor layer 13 and the fourth semiconductor layer 16. In one or more embodiments, the fifth semiconductor layer 17 may perform a function of reducing a lattice constant difference between the fourth semiconductor layer 16 and the second semiconductor layer 13. That is, the fifth semiconductor layer 17 may be a tensile strain barrier reducing (TSBR) layer. For example, the fifth semiconductor layer 17 may include p-GaInP, p-AlInP, p-AlGaInP, and the like, but is not limited thereto. In addition, a length of the third semiconductor layer 15, the fourth semiconductor layer 16, and the fifth semiconductor layer 17 may have a range of 0.08 µm to 0.25 µm but is not limited thereto.

The first electrode layer 14a and the second electrode layer 14b may be disposed on the first semiconductor layer 11 and the second semiconductor layer 13, respectively. The first electrode layer 14a may be disposed on a lower surface of the first semiconductor layer 11, and the second electrode layer 14b may be disposed on an upper surface of the second semiconductor layer 13. However, the present disclosure is not limited thereto, at least one of the first electrode layer 14a and the second electrode layer 14b may be omitted. For example, in the light emitting element LD, the first electrode layer 14a may not be disposed on the lower surface of the first semiconductor layer 11, and only one second electrode layer 14b may be disposed on the upper surface of the second semiconductor layer 13. Each of the first electrode layer 14a and the second electrode layer 14b may include at least one of the materials discussed with respect to the electrode layer 14 of FIG. 5.

The following embodiments are described as an example to which the light emitting element LD shown in FIGS. 1 and 2 is applied, but a person skilled in the art may apply various shapes of light emitting elements including the light emitting element LD shown in FIGS. 3 to 7 to one or more embodiments.

Figure 8:
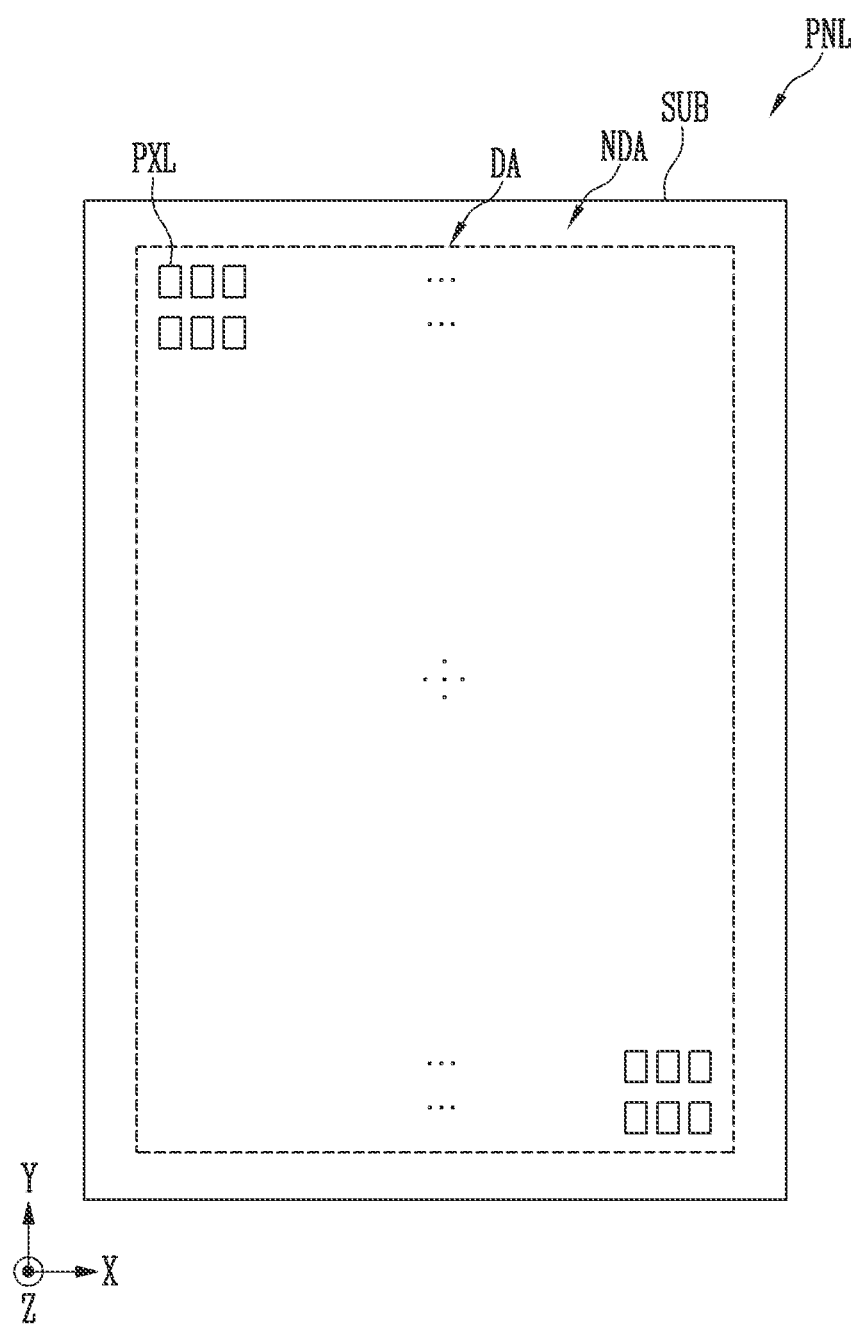
FIG. 8 is a plan view illustrating a display device according to one or more embodiments.

FIG. 8 is a plan view illustrating a display device according to one or more embodiments.

FIG. 8 shows a display device, particularly, a display panel PNL provided in the display device, as an example of a device capable of using the above-described light emitting element LD as a light source.

Referring to FIG. 8, the display panel PNL may include a substrate SUB and a pixel PXL (or a sub-pixel) disposed on the substrate SUB. Specifically, the display panel PNL and the substrate SUB may include a display area DA in which an image is displayed and a non-display area NDA excluding the display area DA. The non-display area NDA may be around an edge or periphery of the display area DA.

The substrate SUB may be a rigid substrate or a flexible substrate, and a material or a physical property thereof is not particularly limited. For example, the substrate SUB may be a rigid substrate formed of glass or tempered glass, or a flexible substrate formed of a thin film configured of a plastic or metal material. In addition, the substrate SUB may be a transparent substrate, but is not limited thereto. For example, the substrate SUB may be a translucent substrate, an opaque substrate, or a reflective substrate.

The display panel PNL and the substrate SUB may include the display area DA for displaying an image and the non-display area NDA in which no image is displayed. The non-display area NDA may be disposed to be around (e.g., to surround in a plan view) the display area DA but is not necessarily limited thereto. The display area DA may include a plurality of pixels PXL. The pixels PXL may include at least one light emitting element LD driven by a scan signal and a data signal, for example, at least the light emitting diode according to any one of the embodiments of FIGS. 1 to 7. The plurality of light emitting diodes may configure a light source of the pixel PXL.

Although FIG. 8 illustrates an embodiment in which the pixels PXL are arranged in a stripe shape in the display area DA, the present disclosure is not limited thereto, and the pixels PXL may be disposed in various pixel arrangement types such as PENTILE®. The PENTILE® arrangement structure may be referred to as an RGBG matrix structure (e.g., a PENTILE® matrix structure or an RGBG structure (e.g., a PENTILE® structure)). PENTILE® is a registered trademark of Samsung Display Co., Ltd., Republic of Korea.

The pixel PXL may be connected to a scan line and a data line and may also be connected to a high potential power line and a low potential power line. The pixel PXL may emit light with a luminance corresponding to a data signal transmitted through the data line in response to a scan signal transmitted through the scan line.

FIGS. 9 to 12 are circuit diagrams illustrating a pixel according to one or more embodiments.

Figure 9:
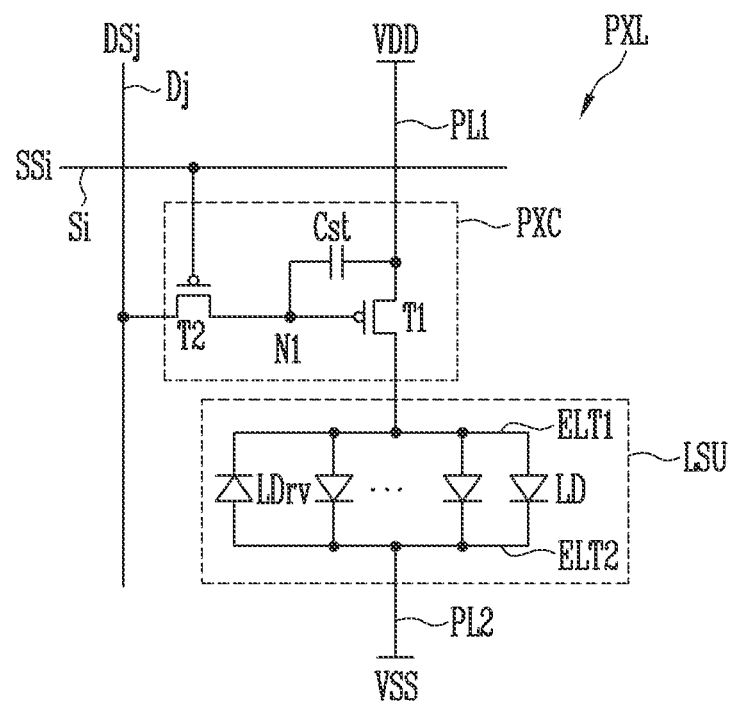
FIGS. 9 to 12 are circuit diagrams illustrating a pixel according to one or more embodiments.

Referring to FIG. 9, the pixel PXL includes a light source unit LSU for generating light of a luminance corresponding to the data signal. In addition, the pixel PXL may selectively further include a pixel circuit PXC for driving the light source unit LSU.

The light source unit LSU may include at least one light emitting element LD, for example, a plurality of light emitting elements LD, connected between first power VDD and second power VSS. For example, the light source unit LSU may include a first electrode ELT1 (also referred to as a "first pixel electrode" or a "first alignment electrode") connected to the first power VDD via the pixel circuit PXC and a first power line PL1, a second electrode ELT2 (also referred to as a "second pixel electrode" or a "second alignment electrode") connected to the second power VSS through a second power line PL2, and the plurality of light emitting elements LD connected in parallel in the same direction between the first and second electrodes ELT1 and ELT2. In one or more embodiments, the first electrode ELT1 may be an anode electrode, and the second electrode ELT2 may be a cathode electrode.

Each of the light emitting elements LD may include the first end (for example, a P-type end) connected to the first power VDD through the first electrode ELT1 and/or the pixel circuit PXC, and a second end (for example, an N-type end) connected to the second power VSS through the second electrode ELT2. That is, the light emitting elements LD may be connected in parallel in a forward direction between the first and second electrodes ELT1 and ELT2. Each light emitting element LD connected in the forward direction between the first power VDD and the second power VSS may configure each effective light source, and the effective light sources may be collected to configure the light source unit LSU of the pixel PXL.

According to one or more embodiments, the first power VDD and the second power VSS may have different potentials so that the light emitting elements LD emit light. For example, the first power VDD may be set as high potential power, and the second power VSS may be set as low potential power. At this time, a potential difference between the first power VDD and the second power VSS may be set to be equal to or greater than a threshold voltage of the light emitting elements LD during an emission period of the pixel PXL.

According to one or more embodiments, one end (for example, the P-type end) of the light emitting elements LD configuring each light source unit LSU may be commonly connected to the pixel circuit PXC through one electrode (for example, the first electrode ELT1 of each pixel PXL) of the light source unit LSU and may be connected to the first power VDD through the pixel circuit PXC and the first power line PL1. In addition, the other end (for example, the N-type end) of the light emitting elements LD may be commonly connected to the second power VSS through another electrode (for example, the second electrode ELT2 of each pixel PXL) of the light source unit LSU and the second power line PL2.

The light emitting elements LD may emit light with a luminance corresponding to a driving current supplied through a corresponding pixel circuit PXC. For example, during each frame period, the pixel circuit PXC may supply a driving current corresponding to a grayscale value to be expressed in a corresponding frame to the light source unit LSU. The driving current supplied to the light source unit LSU may be divided and may flow to the light emitting elements LD connected in the forward direction. Accordingly, while each light emitting element LD emits light with a luminance corresponding to the current flowing therethrough, the light source unit LSU may emit light of a luminance corresponding to the driving current.

In one or more embodiments, the light source unit LSU may further include at least one ineffective light source in addition to the light emitting elements LD configuring each effective light source. For example, at least one reverse light emitting element LDrv may be further connected between the first and second electrodes ELT1 and ELT2.

Each reverse light emitting element LDrv may be connected in parallel between the first and second electrodes ELT1 and ELT2 together with the light emitting elements LD configuring the effective light sources, and may be connected between the first and second electrodes ELT1 and ELT2 in a direction opposite to that of the light emitting elements LD. For example, an N-type end of the reverse light emitting element LDrv may be connected to the first power VDD via the first electrode ELT1 and the pixel circuit PXC, and a P-type end of the reverse light emitting element LDrv may be connected to the second power VSS through the second electrode ELT2. The reverse light emitting element LDrv may maintain a deactivated state even though a suitable driving voltage (e.g., a predetermined driving voltage, such as, for example, a driving voltage of the forward direction) is applied between the first and second electrodes ELT1 and ELT2, and thus the reverse light emitting element LDrv may substantially maintain a non-emission state.

In addition, according to one or more embodiments, at least one pixel PXL may further include at least one ineffective light source that is not completely connected between the first and second electrodes ELT1 and ELT2. For example, at least one pixel PXL may further include at least one ineffective light emitting element positioned in the light source unit LSU and having first and second ends that are not completely connected to the first and second electrodes ELT1 and ELT2.

The pixel circuit PXC is connected between the first power VDD and the first electrode ELT1. The pixel circuit PXC may be connected to a scan line Si and a data line Dj of a corresponding pixel PXL. For example, when the pixel PXL is disposed on an i-th (i is a natural number) horizontal line (row) and a j-th (j is a natural number) vertical line (column) of the display area DA, the pixel circuit PXC of the pixel PXL may be connected to an i-th scan line Si and a j-th data line Dj of the display area DA.

According to one or more embodiments, the pixel circuit PXC may include a plurality of transistors and at least one capacitor. For example, the pixel circuit PXC may include a first transistor T1, a second transistor T2, and a storage capacitor Cst.

The first transistor T1 is connected between the first power VDD and the light source unit LSU. For example, a first electrode (for example, a source electrode) of the first transistor T1 may be connected to the first power VDD, and a second electrode (for example, a drain electrode) of the first transistor T1 may be connected to the first electrode ELT1. In addition, a gate electrode of the first transistor T1 is connected to a first node N1. The first transistor T1 controls the driving current supplied to the light source unit LSU in response to a voltage of the first node N1. That is, the first transistor T1 may be a driving transistor that controls the driving current of the pixel PXL.

The second transistor T2 is connected between the data line Dj and the first node N1. For example, a first electrode (for example, a source electrode) of the second transistor T2 may be connected to the data line Dj, and a second electrode (for example, a drain electrode) of the second transistor T2 may be connected to the first node N1. In addition, a gate electrode of the second transistor T2 is connected to the scan line Si. The second transistor T2 is turned on when a scan signal SSi of a gate-on voltage (for example, a low-level voltage) is supplied from the scan line Si, to electrically connect the data line Dj and the first node N1.

For each frame period, a data signal DSj of a corresponding frame is supplied to the data line Dj, and the data signal DSj is transmitted to the first node N1 through the turned on second transistor T2 during a period in which the scan signal SSi of the gate-on voltage is supplied. That is, the second transistor T2 may be a switching transistor for transmitting each data signal DSj to an inside of the pixel PXL.

One electrode of the storage capacitor Cst is connected to the first power VDD, and another electrode is connected to the first node N1. The storage capacitor Cst charges a voltage (or holds a charge) corresponding to the data signal DSj supplied to the first node N1 during each frame period.

In one or more embodiments, in FIG. 9, transistors included in the pixel circuit PXC, for example, both of the first and second transistors T1 and T2 are shown as P-type transistors, but the present disclosure is not limited thereto. That is, at least one of the first and second transistors T1 and T2 may be changed to an N-type transistor.

In one or more embodiments, a structure of the pixel circuit PXC is not limited to the embodiment shown in FIG. 9. For example, the pixel circuit PXC may be configured as in an embodiment shown in FIG. 10. In addition, the pixel circuit PXC may be configured of a pixel circuit of various structures and/or driving methods.

Figure 10:
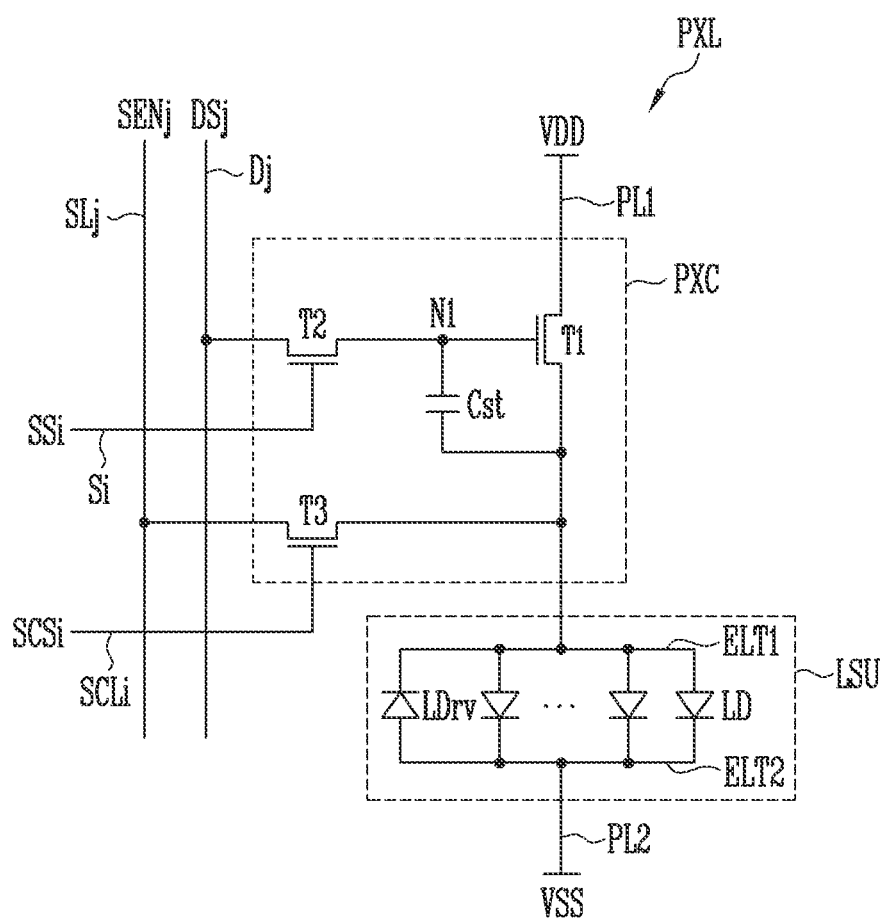

Referring to FIG. 10, the pixel circuit PXC may be further connected to a sensing control line SCLi and a sensing line SLj. For example, the pixel circuit PXC of the pixel PXL disposed on the i-th horizontal line and the j-th vertical line of the display area DA may be connected to an i-th sensing control line SCLi and a j-th sensing line SLj of the display area DA. The pixel circuit PXC may further include a third transistor T3. Alternatively, in one or more embodiments, the sensing line SLj may be omitted, and a characteristic of the pixel PXL may be detected by detecting a sensing signal SENj through the data line Dj of a corresponding pixel PXL (or adjacent pixel).

The third transistor T3 is connected between the first transistor T1 and the sensing line SLj. For example, one electrode of the third transistor T3 may be connected to the one electrode (for example, the source electrode) of the first transistor T1 connected to the first electrode ELT1, and another electrode of the third transistor T3 may be connected to the sensing line SLj. In one or more embodiments, when the sensing line SLj is omitted, the other electrode of the third transistor T3 may be connected to the data line Dj.

A gate electrode of the third transistor T3 is connected to the sensing control line SCLi. When the sensing control line SCLi is omitted, the gate electrode of the third transistor T3 may be connected to the scan line Si. The third transistor T3 may be turned on by a sensing control signal SCSi of a gate-on voltage (for example, a high-level voltage) supplied to the sensing control line SCLi during a suitable sensing period (e.g., a predetermined sensing period), to electrically connect the sensing line SLj and the first transistor T1.

According to one or more embodiments, the sensing period may be a period for extracting a characteristic (for example, a threshold voltage or the like of the first transistor T1) of each of the pixels PXL disposed in the display area DA. During the sensing period, a suitable reference voltage (e.g., a predetermined reference voltage) at which the first transistor T1 may be turned on is supplied to the first node N1 through the data line Dj and the second transistor T2 to turn on the first transistor T1, or each pixel PXL may be connected to a current source or the like. In addition, the first transistor T1 may be connected to the sensing line SLj by supplying the sensing control signal SCSi of the gate-on voltage to the third transistor T3 to turn on the third transistor T3. Thereafter, the sensing signal SENj may be obtained through the sensing line SLj, and the characteristic of each pixel PXL, including the threshold voltage or the like of the first transistor T1, may be detected using the sensing signal SENj. Information on the characteristic of each pixel PXL may be used to convert image data so that a characteristic deviation between the pixels PXL disposed in the display area DA may be compensated.

In one or more embodiments, FIG. 10 shows a case in which all of the first, second, and third transistors T1, T2, and T3 are N-type transistors, but the present disclosure is not limited thereto. For example, at least one of the first, second, and third transistors T1, T2, and T3 may be changed to a P-type transistor. In addition, FIG. 10 discloses an embodiment in which the light source unit LSU is connected between the pixel circuit PXC and the second power VSS, but the present disclosure is not limited thereto. For example, in one or more embodiments, the light source unit LSU may be connected between the first power VDD and the pixel circuit PXC.

Figure 11:
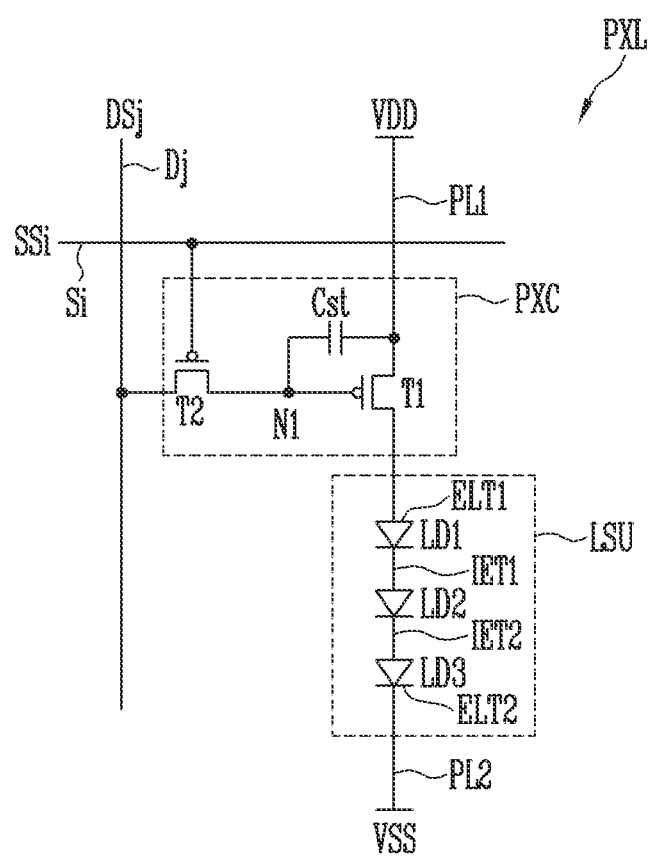
Figure 12:
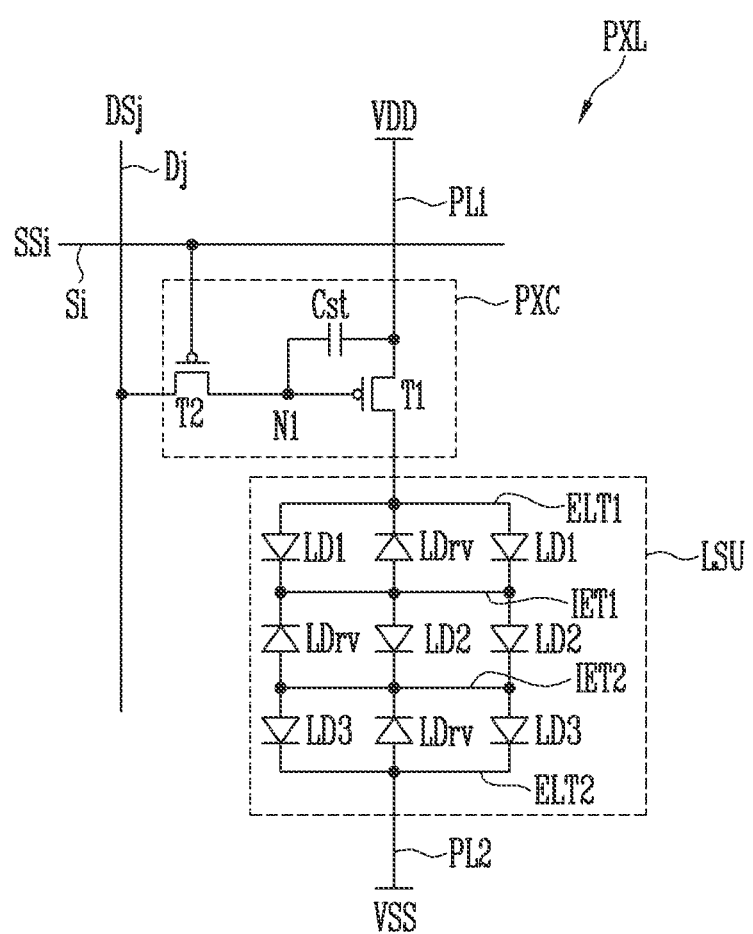

In addition, FIGS. 9 and 10 show embodiments in which the effective light sources configuring each light source unit LSU, that is, all light emitting elements LD are connected in parallel, but the present disclosure is not limited thereto. For example, in one or more embodiments of the present disclosure, as shown in FIGS. 11 and 12, the light source unit LSU of each pixel PXL may be configured to include a series structure of at least two stages. In describing embodiments of FIGS. 11 and 12, a detailed description of a configuration (for example, the pixel circuit PXC) similar to or identical to that of the embodiments of FIGS. 9 and 10 is omitted.

Referring to FIG. 11, the light source unit LSU may include at least two light emitting elements connected in series with each other. For example, the light source unit LSU may include a first light emitting element LD1, a second light emitting element LD2, and a third light emitting element LD3 connected in series in the forward direction between the first power VDD and the second power VSS. Each of the first, second, and third light emitting elements LD1, LD2, and LD3 may configure each effective light source.

Hereinafter, when a specific light emitting element is referred to from among the first, second, and third light emitting elements LD1, LD2, and LD3, a corresponding light emitting element is referred to as the "first light emitting element LD1", the "second light emitting element LD2", or the "third light emitting element LD3". In addition, when at least one of the first, second, and third light emitting elements LD1, LD2, and LD3 is arbitrary referred to, or the first, second, and third light emitting elements LD1, LD2, and LD3 are collectively referred to, at least one of the first, second, and third light emitting elements LD1, LD2, and LD3 or the first, second, and third light emitting elements LD1, LD2, and LD3 will be referred to as the "light emitting element LD" or "light emitting elements LD".

A first end (for example, a P-type end) of the first light emitting element LD1 is connected to the first power VDD via the first electrode (that is, the first electrode ELT1) or the like of the light source unit LSU. In addition, a second end (for example, an N-type end) of the first light emitting element LD1 is connected to a first end (for example, a P-type end) of the second light emitting element LD2 through a first intermediate electrode IET1.

The first end (for example, a P-type end) of the second light emitting element LD2 is connected to the second end of the first light emitting element LD1. In addition, a second end (for example, an N-type end) of the second light emitting element LD2 is connected to a first end (for example, a P-type end) of the third light emitting element LD3 through a second intermediate electrode IET2.

The first end (for example, a P-type end) of the third light emitting element LD3 is connected to the second end of the second light emitting element LD2. In addition, a second end (for example, an N-type end) of the third light emitting element LD3 may be connected to the second power VSS via the second electrode (that is, the second electrode ELT2) or the like of the light source unit LSU. In the above-described method, the first, second, and third light emitting elements LD1, LD2, LD3 may be sequentially connected in series between the first and second electrodes ELT1 and ELT2 of the light source unit LSU.

FIG. 11 shows an embodiment in which the light emitting elements LD are connected in a three-stage series structure, but the present disclosure is not limited thereto. For example, in one or more embodiments of the present disclosure, two light emitting elements LD may be connected in a two-stage series structure, or four or more light emitting elements LD may be connected in a four-stage or more series structure.

Assuming that the same luminance is expressed using light emitting elements LD of the same condition (for example, the same size and/or number), in the light source unit LSU of a structure in which the light emitting elements LD are connected in series, a voltage applied between the first and second electrodes ELT1 and ELT2 may be increased and a magnitude of the driving current flowing through the light source unit LSU may be decreased compared to the light source unit LSU of a structure in which the light emitting elements LD are connected in parallel. Therefore, when the light source unit LSU of each pixel PXL is configured by applying the series structure, a panel current flowing through the display panel PNL may be reduced.

In one or more embodiments, at least one series stage may include a plurality of light emitting elements LD connected in parallel to each other. In this case, the light source unit LSU may be configured as a series/parallel mixed structure. For example, the light source unit LSU may be configured as in an embodiment of FIG. 12.

Referring to FIG. 12, at least one series stage configuring the light source unit LSU may include a plurality of light emitting elements LD connected in parallel in the forward direction. For example, the light source unit LSU may include at least one first light emitting element LD1 disposed in a first series stage (also referred to as a "first stage"), at least one second light emitting element LD2 disposed in a second series stage (also referred to as a "second stage") subsequent to the first series stage, and at least one third light emitting element LD3 disposed in a third series stage (also referred to as a "third stage") subsequent to the second series stage. In addition, at least one of the first, second, and third series stages may include a plurality of light emitting elements LD connected in the forward direction.

FIG. 12 shows the light source unit LSU configured of the light emitting elements LD disposed in three series stages, but the present disclosure is not limited thereto. That is, the number of series stages configuring the light source unit LSU may be variously changed. For example, the light source unit LSU may include a plurality of light emitting elements LD distributed in four or more series stages. In addition, the number of light emitting elements LD connected to each series stage in the forward direction may be variously changed.

According to one or more embodiments, the pixels PXL disposed in the display area DA may include light emitting elements LD of the same or similar numbers. For example, in supplying the light emitting elements LD to each pixel PXL, the light emitting elements LD may be aligned by controlling a light emitting element ink (e.g., also referred to as "light emitting element solution") including the light emitting elements LD to be applied in a substantially uniform amount (e.g., a uniform amount) to the emission area of each pixel PXL and controlling a uniform electric field (e.g., a substantially uniform electric field) to be applied to each pixel PXL. Accordingly, the light emitting elements LD may be relatively uniformly supplied to the pixels PXL and aligned in the pixels PXL.

In one or more embodiments, each pixel PXL may further include at least one reverse light emitting element LDrv disposed in at least one series stage, as shown in FIG. 12. For example, at least one of the plurality of series stages may further include at least one reverse light emitting element LDrv connected in a direction opposite to that of the light emitting elements LD.

However, even though the reverse light emitting element LDrv is connected to at least one series stage, when at least one effective light source (for example, the first, second, and/or third light emitting element LD1, LD2, and/or LD3) connected in the forward direction to the series stage are disposed, the driving current of the pixel PXL flows sequentially through each series stage. Accordingly, the light source unit LSU emits light with a luminance corresponding to the driving current.

As in the above-described embodiments, each light source unit LSU may include the plurality of light emitting elements LD connected in the forward direction between the first power VDD and the second power VSS to configure each effective light source. In addition, a connection structure between the light emitting elements LD may be variously changed according to one or more embodiments. For example, the light emitting elements LD may be connected to each other only in series or in parallel or may be connected in a series/parallel mixed structure.

Figure 13:
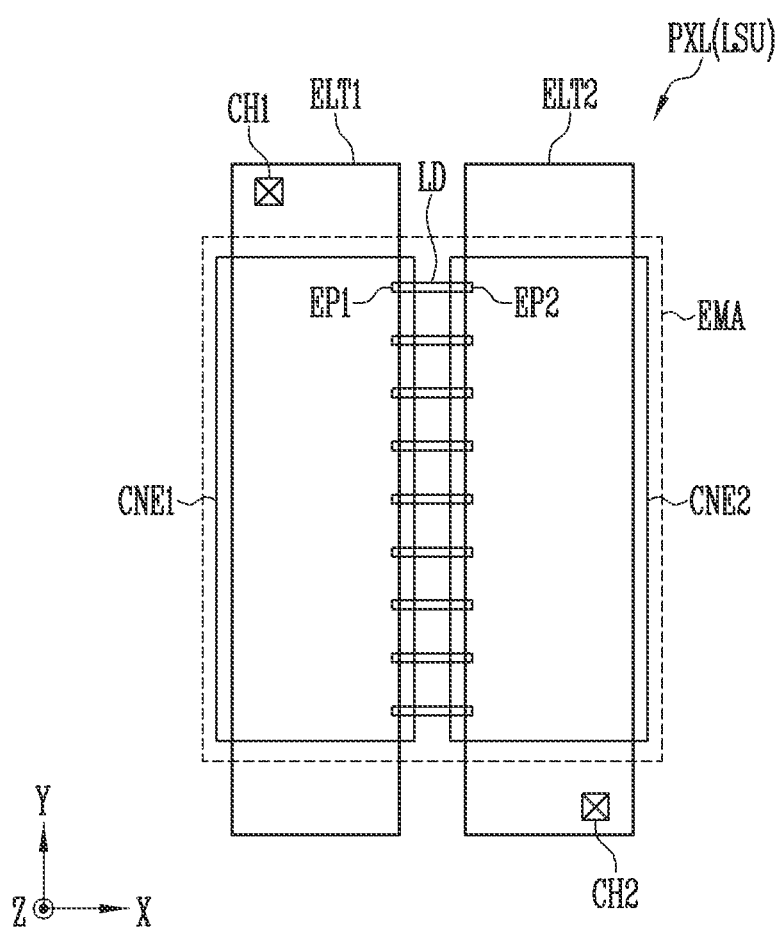
FIGS. 13 and 14 are plan views illustrating a pixel according to one or more embodiments.
Figure 14:
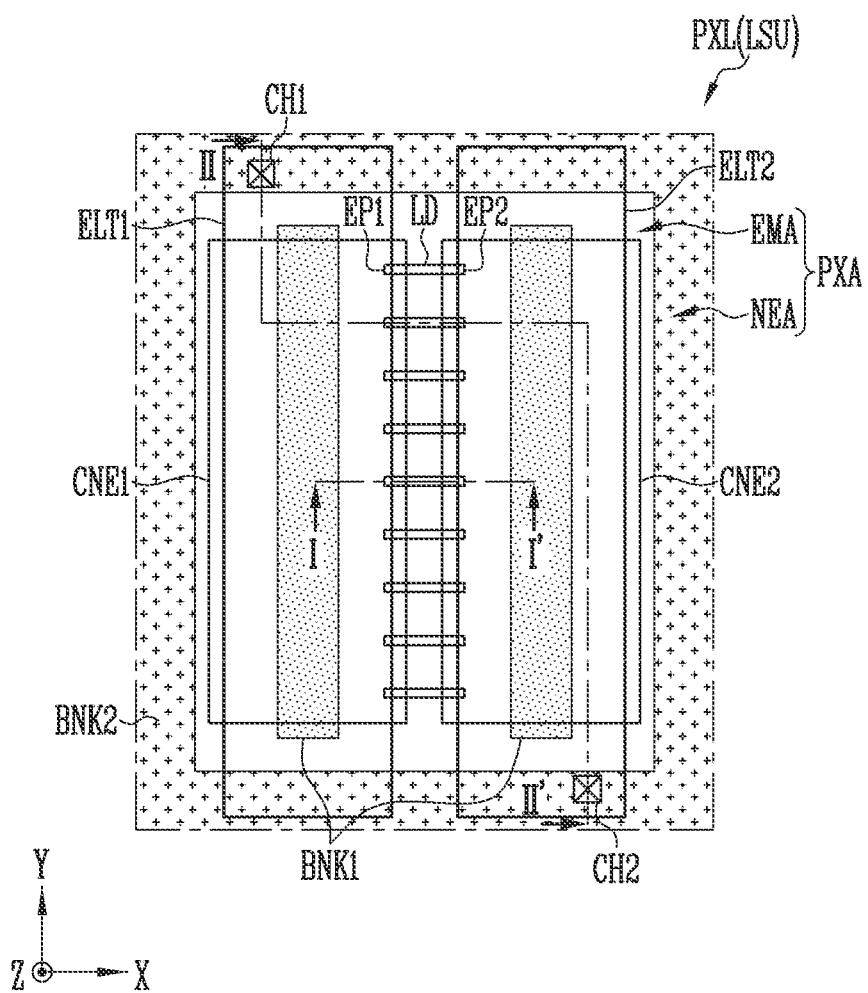

FIGS. 13 and 14 are plan views illustrating a pixel according to one or more embodiments.

FIGS. 13 and 14 show a structure of the pixel PXL centering on the light source unit LSU of each pixel PXL. However, according to one or more embodiments, each pixel PXL may selectively further include circuit elements (for example, a plurality of circuit elements configuring each pixel circuit PXC) connected to the light source unit LSU.

In addition, FIGS. 13 and 14 show an embodiment in which each light source unit LSU is connected to a suitable power line (e.g., a predetermined power line, such as for example, the first and/or second power line PL1 and/or PL2) through first and second contact holes CH1 and CH2, a circuit element (for example, at least one circuit element configuring the pixel circuit PXC) and/or a signal line (for example, the scan line Si and/or the data line Dj). However, the present disclosure is not limited thereto. For example, in one or more embodiments, at least one of the first and second electrodes ELT1 and ELT2 of each pixel PXL may be directly connected to the suitable power line and/or the signal line (e.g., the predetermined power line and/or the signal line) without passing through a contact hole, an intermediate line, and/or the like.

First, referring to FIG. 13, the pixel PXL may include the first electrode ELT1 and the second electrode ELT2 disposed in each emission area EMA, and at least one light emitting element LD (for example, a plurality of light emitting elements LD connected in parallel between the first and second electrodes ELT1 and ELT2) disposed between the first and second electrodes ELT1 and ELT2. In addition, the pixel PXL may further include a first contact electrode CNE1 and a second contact electrode CNE2 electrically connecting the light emitting element LD between the first and second electrodes ELT1 and ELT2.

The first electrode ELT1 and the second electrode ELT2 may be disposed in the emission area EMA of each pixel PXL. The emission area EMA may be an area in which the light emitting elements LD (in particular, the effective light sources completely connected between the first and second electrodes ELT1 and ELT2) configuring the light source unit LSU of each pixel PXL are disposed. In addition, in the emission area EMA, suitable electrodes (e.g., predetermined electrodes, such as, for example, the first and second electrodes ELT1 and ELT2, and/or the first and second contact electrodes CNE1 and CNE2) connected to the light emitting elements LD, or one area of the electrodes may be disposed.

The first and second electrodes ELT1 and ELT2 may be disposed to be spaced from each other. For example, the first and second electrodes ELT1 and ELT2 may be disposed side by side to be spaced at a suitable distance (e.g., a predetermined distance) along a first direction (X-axis direction) in each emission area EMA.

In one or more embodiments, before a process of forming the pixel PXL, in particular, an alignment of the light emitting elements LD is completed, the first electrodes ELT1 of the pixels PXL (e.g., pixels PXL adjacent in the Y-axis direction) disposed in the display area DA may be connected to each other, and the second electrodes ELT2 of the pixels PXL (e.g., pixels PXL adjacent in the Y-axis direction) may be connected to each other. The first and second electrodes ELT1 and ELT2 may receive a first alignment signal (or a first alignment voltage) and a second alignment signal (or a second alignment voltage) in aligning the light emitting elements LD, respectively. For example, any one of the first and second electrodes ELT1 and ELT2 may receive an alignment signal of an alternating current type, and the other one of the first and second electrodes ELT1 and ELT2 may receive an alignment voltage (for example, a ground voltage) having a constant voltage level. That is, a suitable alignment signal (e.g., a predetermined alignment signal) may be applied to the first and second electrodes ELT1 and ELT2 in aligning the light emitting elements LD. Accordingly, an electric field may be formed between the first and second electrodes ELT1 and ELT2. The light emitting elements LD supplied to the emission area EMA of each pixel PXL may be self-aligned between the first and second electrodes ELT1 and ELT2 by the electric field. After the alignment of the light emitting elements LD is completed, the pixels PXL may be formed to be individually driven by disconnecting at least the first electrodes ELT1 between the pixels PXL (e.g., pixels PXL adjacent in the Y-axis direction).

The first and second electrodes ELT1 and ELT2 may have various shapes. For example, as shown in FIGS. 13 and 14, each of the first and second electrodes ELT1 and ELT2 may have a bar shape extending in one direction. For example, each of the first and second electrodes ELT1 and ELT2 may have a bar shape extending along a second direction (Y-axis direction) crossing (for example, orthogonal to) the first direction (X-axis direction).

FIGS. 13 and 14 show a case in which one first electrode ELT1 and one second electrode ELT2 is disposed in each emission area EMA, but the number and a disposition of the first and second electrodes ELT1 and ELT2 disposed in the emission area EMA of the pixel PXL may be variously changed. For example, in one or more embodiments, a plurality of first electrodes ELT1 and/or second electrodes ELT2 may be disposed in the emission area EMA of each pixel PXL.

When a plurality of first electrodes ELT1 are disposed in one pixel PXL, the first electrodes ELT1 may be integrally or non-integrally connected to each other. For example, the first electrodes ELT1 may be integrally connected or may be connected to each other by a bridge pattern positioned in a layer (for example, a circuit layer in which the pixel circuit PXC is disposed) different from that of the first electrodes ELT1. Similarly, when a plurality of second electrodes ELT2 are disposed in one pixel PXL, the second electrodes ELT2 may be integrally or non-integrally connected to each other. For example, the second electrodes ELT2 may be integrally connected or may be connected to each other by a bridge pattern positioned in a layer different from that of the second electrodes ELT2. That is, the shape, number, arrangement direction, mutual disposition relationship, and/or the like of the first and second electrodes ELT1 and ELT2 disposed in each pixel PXL may be variously changed.

The first electrode ELT1 may be electrically connected to a suitable circuit element (e.g., a predetermined circuit element, such as, for example, at least one transistor configuring the pixel circuit PXC), a power line (for example, the first power line PL1), and/or the signal line (for example, the scan line Si, the data line Dj, or a suitable control line (e.g., a predetermined control line)) through the first contact hole CH1. However, the present disclosure is not limited thereto. For example, in one or more embodiments, the first electrode ELT1 may be directly connected to a suitable power line or signal line (e.g., a predetermined power line or signal line).

In one or more embodiments, the first electrode ELT1 may be electrically connected to a suitable circuit element (e.g., a predetermined circuit element) disposed under the first electrode ELT1 through the first contact hole CH1 and may be electrically connected to a first line through the circuit element. The first line may be the first power line PL1 for supplying the first power VDD, but is not limited thereto. For example, the first line may be a signal line supplied with a suitable first driving signal (e.g., a predetermined first driving signal, such as for example, a scan signal, a data signal, or a suitable control signal (e.g., a predetermined control signal)).

The second electrode ELT2 may be electrically connected to a suitable circuit element (e.g., a predetermined circuit element, such as, for example, at least one transistor configuring the pixel circuit PXC), a power line (for example, the second power line PL2), and/or a signal line (for example, the scan line Si, the data line Dj, or a suitable control line (e.g., a predetermined control line)) through the second contact hole CH2. However, the present disclosure is not limited thereto. For example, in one or more embodiments, the second electrode ELT2 may be directly connected to a suitable power line or signal line (e.g., a predetermined power line or signal line).

In one or more embodiments, the second electrode ELT2 may be electrically connected to a second line disposed under the second electrode ELT2 through the second contact hole CH2. The second line may be the second power line PL2 for supplying the second power VSS but is not limited thereto. For example, the second line may be a signal line supplied with a suitable second driving signal (e.g., a predetermined second driving signal, such as, for example, a scan signal, a data signal, or a suitable control signal (e.g., a predetermined control signal)).

The light emitting elements LD may be connected between the first electrode ELT1 and the second electrode ELT2. For example, each light emitting element LD may be disposed in the first direction (X-axis direction) between the first electrode ELT1 and the second electrode ELT2 and may be electrically connected between the first and second electrodes ELT1 and ELT2.

FIGS. 13 and 14 show that all light emitting elements LD are uniformly aligned in the first direction (X-axis direction), but the present disclosure is not limited thereto. For example, at least one of the light emitting elements LD may be aligned in a diagonal direction or the like between the first and second electrodes ELT1 and ELT2.

According to one or more embodiments, each light emitting element LD may be an ultra-small light emitting element of a small size as small as, for example, a nano scale to a micro scale, using a material of an inorganic crystal structure. For example, each light emitting element LD may be an ultra-small light emitting element having a size of a nano scale to micro scale range, as shown in FIGS. 1 to 7. However, the type and/or size of the light emitting element LD may be variously changed according to a design condition or the like of each light emitting device using the light emitting element LD as a light source, for example, the pixel PXL.

Each light emitting element LD may include a first end EP1 disposed toward the first electrode ELT1, and a second end EP2 disposed toward the second electrode ELT2. The first end EP1 of each of the light emitting elements LD may be electrically connected to the first electrode ELT1, and the second end EP2 of each of the light emitting elements LD may be electrically connected to the second electrode ELT2. For example, the first end EP1 of each of the light emitting elements LD may be electrically connected to the first electrode ELT1 through the first contact electrode CNE1, and the second end EP2 of each of the light emitting elements LD may be electrically connected to the second electrode ELT2 through the second contact electrode CNE2. In one or more embodiments, the first end EP1 of each of the light emitting elements LD may be electrically connected to the first electrode ELT1 by directly contacting the first electrode ELT1. Similarly, the second end EP2 of each of the light emitting elements LD may be electrically connected to the second electrode ELT2 by directly contacting the second electrode ELT2. In this case, the first contact electrode CNE1 and/or the second contact electrode CNE2 may be selectively formed.

According to one or more embodiments, the light emitting elements LD may be prepared in a form dispersed in a suitable solution (e.g., a predetermined solution), and may be supplied to the emission area EMA of the pixel PXL through various methods including an inkjet method or a slit coating method. For example, the light emitting elements LD may be mixed with a volatile solvent and supplied to the emission area EMA of each pixel PXL. At this time, when a suitable alignment voltage (e.g., a predetermined alignment voltage or alignment signal) is applied to the first and second electrodes ELT1 and ELT2 of the pixels PXL, the light emitting elements LD are aligned between the first and second electrodes ELT1 and ELT2 while an electric field is formed between the first and second electrodes ELT1 and ELT2. After the light emitting elements LD are aligned, the light emitting elements LD may be stably arranged between the first and second electrodes ELT1 and ELT2 by volatilizing the solvent or removing the solvent in other methods.

According to one or more embodiments, the first contact electrode CNE1 and the second contact electrode CNE2 may be formed on the both ends of the light emitting elements LD, for example, the first and second ends EP1 and EP2, respectively. Accordingly, the light emitting elements LD may be more stably connected between the first and second electrodes ELT1 and ELT2.

The first contact electrode CNE1 may be disposed on the first electrode ELT1 and the first end EP1 of the light emitting element LD so as to overlap the first electrode ELT1 and the first end EP1 of at least one light emitting element LD adjacent to the first electrode ELT1. The first contact electrode CNE1 may electrically connect the first electrode ELT1 and the first ends EP1 of the light emitting elements LD. In addition, the first contact electrode CNE1 may stably fix the first ends EP1 of the light emitting elements LD. In one or more embodiments, when the first contact electrode CNE1 is not formed, the first ends EP1 of the light emitting elements LD may be disposed to overlap the first electrode ELT1 adjacent to the first ends EP1 and may be directly connected to the first electrode ELT1.

The second contact electrode CNE2 may be disposed on the second electrode ELT2 and the second end EP2 of the light emitting element LD so as to overlap the second electrode ELT2 and the second end EP2 of at least one light emitting element LD adjacent to the second electrode ELT2. The second contact electrode CNE2 may electrically connect the second electrode ELT2 and the second ends EP2 of the light emitting elements LD. In addition, the second contact electrode CNE2 may stably fix the second ends EP2 of the light emitting elements LD. In one or more embodiments, when the second contact electrode CNE2 is not formed, the second ends EP2 of the light emitting elements LD may be disposed to overlap the second electrode ELT2 adjacent to the second ends EP2 and may be directly connected to the second electrode ELT2.

In the above-described embodiments, each light emitting element LD connected in a forward direction between the first and second electrodes ELT1 and ELT2 may configure the effective light source of a corresponding pixel PXL. In addition, the effective light sources may be collected to configure the light source unit LSU of the corresponding pixel PXL.

For example, when the first power VDD (or a suitable first control signal (e.g., a predetermined first control signal) including the scan signal, the data signal, or the like) is applied to the first ends EP1 of the light emitting elements LD via the first power line PL1, the first electrode ELT1, the first contact electrode CNE1, and/or the like, and the second power VSS (or a suitable second control signal (e.g., a predetermined second control signal) including the scan signal, the data signal, or the like) is applied to the second ends EP2 of the light emitting elements LD via the second power line PL2, the second electrode ELT2, the second contact electrode CNE2, and/or the like, the light emitting elements LD connected in the forward direction between the first and second electrodes ELT1 and ELT2 emit light. Accordingly, light is emitted from the pixel PXL.

Referring to FIG. 14, the pixel PXL may further include a first bank BNK1 overlapping the first and second electrodes ELT1 and ELT2, and a second bank BNK2 around (e.g., surrounding) each emission area EMA.

The first bank BNK1 (also referred to as a "partition wall") may be disposed under the first and second electrodes ELT1 and ELT2. For example, the first bank BNK1 may be disposed under the first and second electrodes ELT1 and ELT2 to overlap one area of each of the first and second electrodes ELT1 and ELT2.

As the first bank BNK1 is disposed under one area of each of the first and second electrodes ELT1 and ELT2, the first and second electrodes ELT1 and ELT2 may protrude in an upward direction (e.g., the third direction (Z-axis direction)) in an area in which the first bank BNK1 is formed. The first bank BNK1 may configure a reflective bank (also referred to as a "reflective partition wall") together with the first and second electrodes ELT1 and ELT2. For example, the first and second electrodes ELT1 and ELT2 and/or the first bank BNK1 may be formed of a reflective material, or at least one reflective material layer may be formed on the first and second electrodes ELT1 and ELT2 and/or a protruded sidewall of the first bank BNK1. Accordingly, light emitted from the first and second ends EP1 and EP2 of the light emitting elements LD facing (e.g., opposing) the first and second electrodes ELT1 and ELT2 may be induced to be more directed to a front direction of the display panel PNL. As described above, when one area of the first and second electrodes ELT1 and ELT2 is protruded in the upward direction by the first bank BNK1, a ratio of light facing the front direction (e.g., the third direction (Z-axis direction)) of the display panel PNL from among the light generated in the pixel PXL may be increased, and thus light efficiency of the pixel PXL may be improved.

According to one or more embodiments, the first bank BNK1 may be omitted. In this case, the first and second electrodes ELT1 and ELT2 may be formed to be substantially flat or to have a concave-convex surface. For example, one area of the first and second electrodes ELT1 and ELT2 may be protruded in the upward direction by forming each of the first and second electrodes ELT1 and ELT2 in different thicknesses for each area to form the concave-convex surface. Accordingly, the light emitted from the light emitting elements LD may be induced to be directed to the front direction (e.g., the third direction (Z-axis direction)) of the display panel PNL.

The second bank BNK2 may be a structure that defines the emission area EMA of each pixel PXL, and may be, for example, a pixel defining layer. For example, the second bank BNK2 may be disposed in a boundary area of each pixel area PXA in which the pixel PXL is provided and/or an area between adjacent pixels PXL to surround the emission area EMA of each pixel PXL.

The second bank BNK2 may overlap one area (for example, both ends) of the first and second electrodes ELT1 and ELT2 as shown in FIG. 14. In this case, the first and second contact holes CH1 and CH2 may be formed in a non-emission area NEA to overlap the second bank BNK2 or may be formed inside the emission area EMA so as not to overlap the second bank BNK2.

The second bank BNK2 may be configured to include at least one light-blocking and/or reflective material to prevent light leakage between adjacent pixels PXL. For example, the second bank BNK2 may include various types of black matrix materials (for example, at least one suitable light-blocking material), a color filter material of a specific color, and/or the like. For example, the second bank BNK2 may be formed of a black opaque pattern to block light transmission. In one or more embodiments, a reflective layer may be formed on a surface (for example, a side surface) of the second bank BNK2 to further improve the light efficiency of the pixel PXL.

In addition, in supplying the light emitting elements LD to each pixel PXL, the second bank BNK2 may function as a dam structure defining each emission area EMA to which the light emitting elements LD are to be supplied. For example, each emission area EMA may be partitioned by the second bank BNK2, and thus a light emitting element ink of a desired type and/or amount may be supplied to the emission area EMA.

In one or more embodiments, the second bank BNK2 may be concurrently formed (e.g., simultaneously formed) on the same layer as the first banks BNK1 in a process of forming the first banks BNK1 of the pixels PXL. In one or more embodiments, the second bank BNK2 may be formed in a layer that is the same as or different from that of the first banks BNK1 through a process separate from the process of forming the first banks BNK1.

Figure 15:
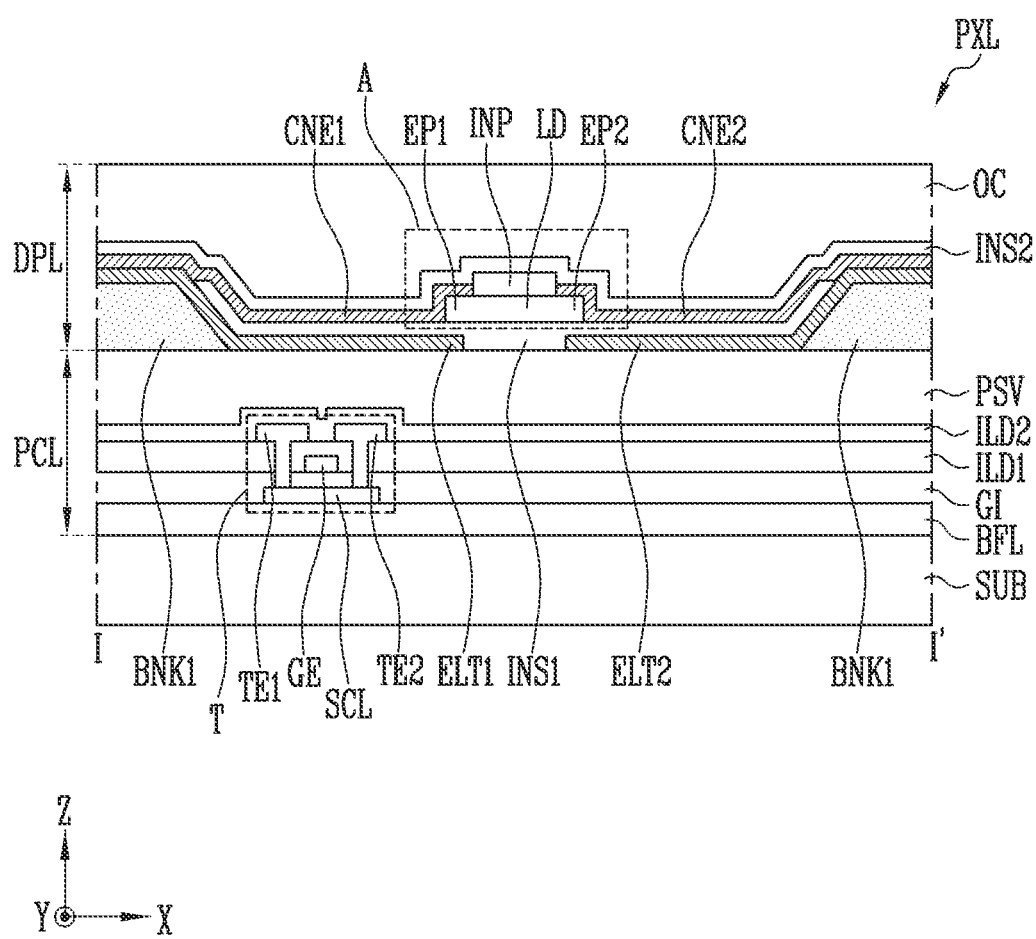
FIGS. 15 and 16 are cross-sectional views of a pixel according to one or more embodiments.
Figure 16:
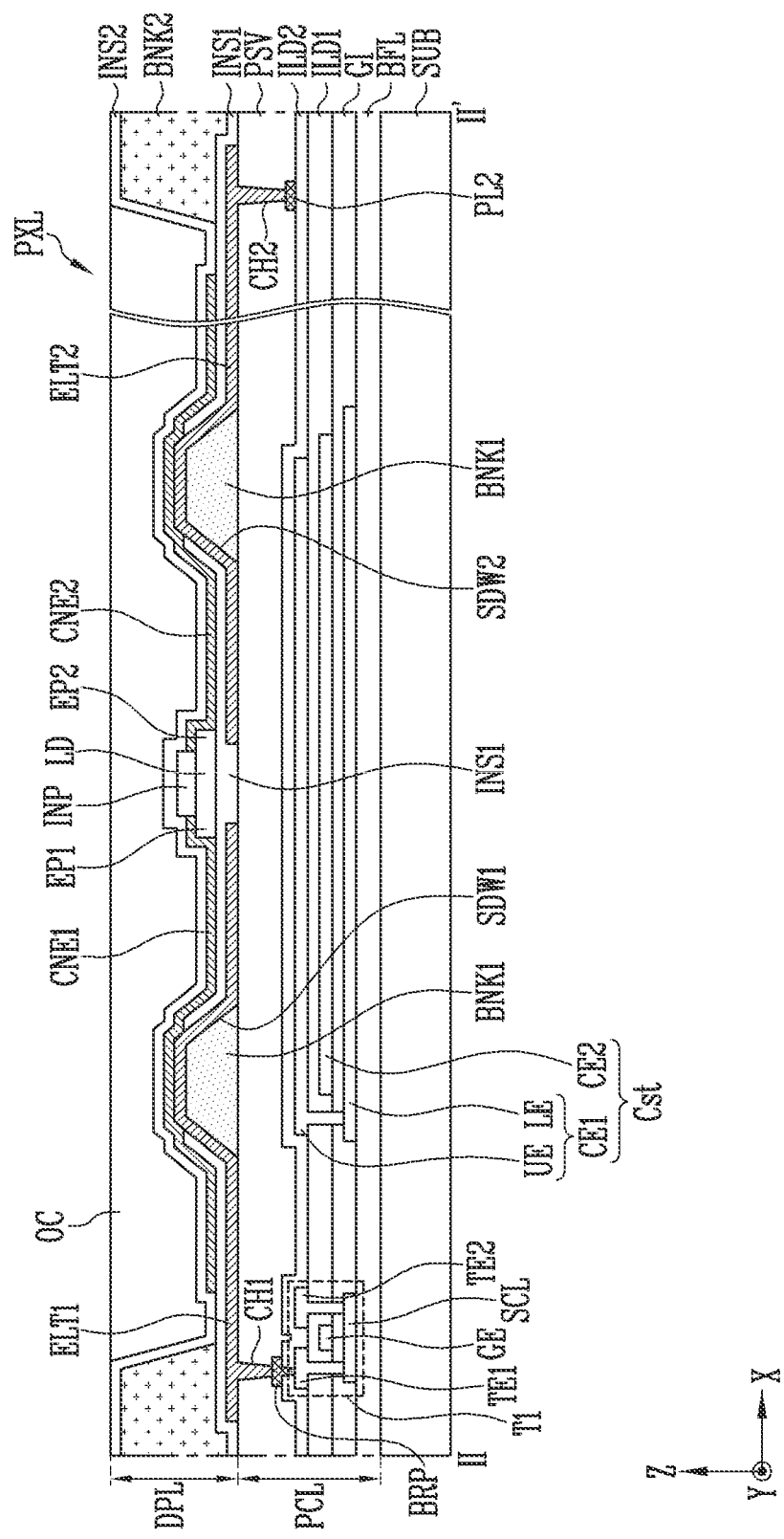
Figure 17:
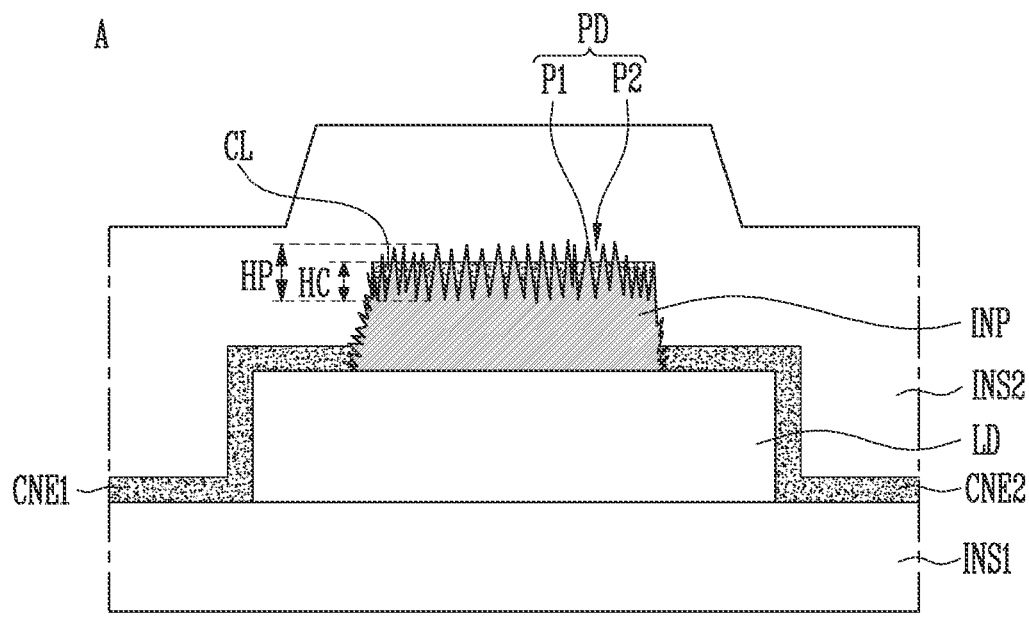
FIG. 17 is an enlarged cross-sectional view of an area A of FIG. 15.

FIGS. 15 and 16 are cross-sectional views of a pixel according to one or more embodiments. For example, FIG. 15 is a cross-sectional view taken along the line I-I' of FIG. 14, and FIG. 16 is a cross-sectional view taken along the line 11-11' of FIG. 14. FIG. 17 is an enlarged cross-sectional view of an area A of FIG. 15.

In order to show various circuit elements configuring the pixel circuit PXC, FIG. 15 shows a transistor T from among the circuit elements, and FIG. 16 shows a transistor (for example, the first transistor T1 of FIG. 9 or the like) connected to the first electrode ELT1, and the storage capacitor Cst, from among the circuit elements. Hereinafter, when it is not necessary to specify the first transistor T1 separately, the first transistor T1 may be collectively referred to as a "transistor T".

In one or more embodiments, a structure, a position of each layer, and/or the like of the transistors T and the storage capacitor Cst are not limited to the embodiment shown in FIG. 16 and may be variously changed according to one or more embodiments. In addition, in one or more embodiments, the transistors T configuring each pixel circuit PXC may have structures substantially identical to or similar to each other but are not limited thereto. For example, in one or more embodiments, at least one of the transistors T configuring the pixel circuit PXC may have a cross-sectional structure different from that of other transistors T, and/or may be disposed at a position different from that of other transistors T.

Referring to FIGS. 15 and 16, the pixels PXL and the display device including the same according to one or more embodiments may include a circuit layer PCL and a light emitting element layer DPL disposed on the circuit layer PCL.

The circuit layer PCL may include a substrate SUB. The substrate SUB may be a rigid substrate or a flexible substrate, and a material or a physical property thereof is not particularly limited. For example, the substrate SUB may be a rigid substrate formed of glass or tempered glass, or a flexible substrate formed of a thin film formed of a plastic or a metal material. In addition, the substrate SUB may be a transparent substrate, but is not limited thereto.

A buffer layer BFL may be disposed on the substrate SUB. The buffer layer BFL may function to smooth a surface of the substrate SUB and prevent penetration of moisture or external air. The buffer layer BFL may be an inorganic layer configured of a single layer or multiple layers.

Various circuit elements such as the transistors T and the storage capacitor Cst, and various lines connected to the circuit elements may be disposed on the buffer layer BFL. According to one or more embodiments, the buffer layer BFL may be omitted, and in this case, at least one circuit element and/or line may be directly disposed on one surface of the substrate SUB.

Each transistor T includes a semiconductor pattern SCL (also referred to as a "semiconductor layer" or an "active layer"), a gate electrode GE, and first and second transistor electrodes TE1 and TE2. FIGS. 15 and 16 show an embodiment in which each transistor T includes the first and second transistor electrodes TE1 and TE2 formed separately from the semiconductor pattern SCL, but the present disclosure is not limited thereto. For example, in one or more embodiments, the first transistor electrode TE1 and/or the second transistor electrode TE2 included in at least one transistor T may be configured integrally with each semiconductor pattern SCL.

The semiconductor pattern SCL may be disposed on the buffer layer BFL. For example, the semiconductor pattern SCL may be disposed between the substrate SUB on which the buffer layer BFL is formed and a gate insulating layer GI. The semiconductor pattern SCL may include a first area contacting a first transistor electrode TE1, a second area contacting a second transistor electrode TE2, and a channel area positioned between the first and second areas. According to one or more embodiments, one of the first and second areas may be a source area and the other one may be a drain area.

According to one or more embodiments, the semiconductor pattern SCL may be a semiconductor pattern formed of poly silicon, amorphous silicon, an oxide semiconductor, or the like. In addition, the channel area of the semiconductor pattern SCL may be an intrinsic semiconductor as a semiconductor pattern that is not doped with an impurity, and each of the first and second areas of the semiconductor pattern SCL may be a semiconductor pattern doped with a suitable impurity (e.g., a predetermined impurity).

In one or more embodiments, the semiconductor patterns SCL of the transistors T configuring each pixel circuit PXC may be formed of substantially the same or similar material. For example, the semiconductor pattern SCL of the transistors T may be formed of any one of the same material from among poly silicon, amorphous silicon, and an oxide semiconductor. In one or more embodiments, a portion of the transistors T and a remaining portion of the transistors T may include semiconductor patterns SCL formed of different materials. For example, the semiconductor pattern SCL of a portion of the transistors T may be formed of poly silicon or amorphous silicon, and the semiconductor pattern SCL of another portion of the transistors T may be formed of an oxide semiconductor.

The gate insulating layer GI may be disposed on the semiconductor pattern SCL and the buffer layer BFL. The gate insulating layer GI may be configured as a single layer or multiple layers and may include at least one inorganic insulating material and/or organic insulating material. For example, the gate insulating layer GI may include various types of organic/inorganic insulating materials including silicon nitride ($SiN_x$), silicon oxide ($SiO_x$), or the like.

The gate electrode GE may be disposed on the gate insulating layer GI. FIGS. 15 and 16 show a transistor T of a top-gate structure, but in one or more embodiments, the transistor T may have a bottom-gate structure. In this case, the gate electrode GE may be disposed under the semiconductor pattern SCL to overlap the semiconductor pattern SCL in the third direction (e.g., the Z-axis direction).

The first interlayer insulating layer ILD1 may be disposed on the gate electrode GE and the gate insulating layer GI. For example, the first interlayer insulating layer ILD1 may be disposed between the gate electrode GE and the first and second transistor electrodes TE1 and TE2. The first interlayer insulating layer ILD1 may be configured as a single layer or multiple layers, and may include at least one inorganic insulating material and/or organic insulating material. For example, the first interlayer insulating layer ILD1 may include various types of organic/inorganic insulating materials including silicon nitride ($SiN_x$), silicon oxide ($SiO_x$), or the like, and a configuration material of the first interlayer insulating layer ILD1 is not particularly limited.

The first and second transistor electrodes TE1 and TE2 may be disposed on each semiconductor pattern SCL with the first interlayer insulating layer ILD1 of at least one layer interposed therebetween. For example, the first and second transistor electrodes TE1 and TE2 may be disposed on the semiconductor pattern SCL with the gate insulating layer GI and the first interlayer insulating layer ILD1 interposed therebetween, and may be disposed on different ends of the semiconductor pattern SCL. The first and second transistor electrodes TE1 and TE2 may be electrically connected to the semiconductor pattern SCL. For example, the first and second transistor electrodes TE1 and TE2 may be connected to the first and second areas of the semiconductor pattern SCL through corresponding contact holes passing through the gate insulating layer GI and the first interlayer insulating layer ILD1. According to one or more embodiments, one of the first and second transistor electrodes TE1 and TE2 may be a source electrode and the other one may be a drain electrode.

At least one transistor T included in the pixel circuit PXC may be connected to at least one pixel electrode. For example, the first transistor T1 shown in FIG. 9 or the like may be electrically connected to the first electrode ELT1 of a corresponding pixel PXL through a contact hole (for example, the first contact hole CH1) passing through a passivation layer PSV, and/or a bridge pattern BRP.

The storage capacitor Cst includes a first capacitor electrode CE1 and a second capacitor electrode CE2 overlapping each other in the third direction (e.g., the Z-axis direction). Each of the first and second capacitor electrodes CE1 and CE2 may be configured as a single layer or multiple layers. In addition, at least one of the first and second capacitor electrodes CE1 and CE2 may be disposed in the same layer as at least one electrode or semiconductor pattern SCL configuring the first transistor T1.

For example, the first capacitor electrode CE1 may be configured as an electrode of multiple layers including a lower electrode LE disposed in the same layer as the semiconductor pattern SCL of the first transistor T1, and an upper electrode UE disposed in the same layer as the first and second transistor electrodes TE1 and TE2 of the first transistor T1 and electrically connected to the lower electrode LE. In addition, the second capacitor electrode CE2 may be configured as an electrode of a single layer disposed in the same layer as the gate electrode of the first transistor T1 and disposed between the lower electrode LE and the upper electrode UE of the first capacitor electrode CE1.

However, a structure and/or a position of each of the first and second capacitor electrodes CE1 and CE2 may be variously changed. For example, in one or more embodiments, any one of the first and second capacitor electrodes CE1 and CE2 may include a conductive pattern disposed in a layer different from that of electrodes configuring the first transistor T1 (for example, the gate electrode GE and the first and second transistor electrodes TE1 and TE2) and the semiconductor pattern SCL. For example, the first capacitor electrode CE1 or the second capacitor electrode CE2 may have a single layer or multiple layer structure including a conductive pattern disposed on a second interlayer insulating layer ILD2.

In one or more embodiments, at least one signal line and/or power line connected to each pixel PXL may be disposed on the same layer as one electrode of the circuit elements configuring the pixel circuit PXC. For example, the scan line Si of each pixel PXL may be disposed on the same layer as the gate electrodes GE of the transistors T, and the data line Dj of each pixel PXL may be disposed on the same layer as the first and second transistor electrodes TE1 and TE2 of the transistors T.

The first and/or second power lines PL1 and/or PL2 may be disposed in the same layer as the gate electrodes GE or the first and second transistor electrodes TE1 and TE2 of the transistors T, or may be disposed in a layer different from that of the gate electrodes GE or the first and second transistor electrodes TE1 and TE2 of the transistors T. For example, the second power line PL2 for supplying the second power VSS may be disposed on the second interlayer insulating layer ILD2 and may be at least partially covered by the passivation layer PSV. The second power line PL2 may be electrically connected to the second electrode ELT2 of the light source unit LSU disposed on the passivation layer PSV through the second contact hole CH2 passing through the passivation layer PSV. However, a position and/or a structure of the first and/or second power lines PL1 and/or PL2 may be variously changed. For example, in one or more embodiments, the second power line PL2 may be disposed in the same layer as the gate electrodes GE or the first and second transistor electrodes TE1 and TE2 of the transistors T, and may be electrically connected to the second electrode ELT2 through at least one bridge pattern and/or the second contact hole CH2.

The second interlayer insulating layer ILD2 may be disposed on the first interlayer insulating layer ILD1 and may cover the first and second transistor electrodes TE1 and TE2 positioned on the first interlayer insulating layer ILD1, the storage capacitor Cst, and/or the like. The second interlayer insulating layer ILD2 may be configured as a single layer or multiple layers and may include at least one inorganic insulating material and/or organic insulating material. For example, the second interlayer insulating layer ILD2 may include various types of organic/inorganic insulating materials such as silicon nitride ($SiN_x$) or silicon oxide ($SiO_x$), and a configuration material of the second interlayer insulating layer ILD2 is not particularly limited. The bridge pattern BRP for connecting at least one circuit element (for example, the first transistor T1) included in the pixel circuit PXC to the first electrode ELT1, the first power line PL1, and/or the second power line PL2 may be disposed on the second interlayer insulating layer ILD2.

However, according to one or more embodiments, the second interlayer insulating layer ILD2 may be omitted. In this case, the bridge pattern BRP or the like of FIG. 16 may be omitted, and the second power line PL2 may be disposed in a layer on which one electrode of the transistor T is disposed.

The passivation layer PSV may be disposed on the circuit elements including the transistors T and the storage capacitor Cst and/or the lines including the first and second power lines PL1 and PL2 and the bridge pattern BRP and the second interlayer insulating layer ILD2. The passivation layer PSV may be configured as a single layer or multiple layers and may include at least one inorganic insulating material and/or organic insulating material. For example, the passivation layer PSV may include at least an organic insulating layer and may substantially planarize a surface of the circuit layer PCL. The light emitting element layer DPL may be disposed on the passivation layer PSV.

The light emitting element layer DPL may include the plurality of electrodes ELT1 and ELT2, the light emitting elements LD, and the first and second electrodes ELT1 and ELT2 configuring the light source unit LSU of each pixel PXL, the plurality of contact electrodes CNE1 and CNE2 for more stably connecting the light emitting elements LD, and an insulating pattern INP. In addition, the light emitting element layer DPL may selectively further include the first bank BNK1 for protruding one area of each of the first and second electrodes ELT1 and ELT2 upward, and/or the second bank BNK2 surrounding each emission area EMA. The first bank BNK1 may be disposed on the passivation layer PSV of the circuit layer PCL The first bank BNK1 may be formed in a separated type or integrated type of pattern. The first bank BNK1 may protrude in the third direction (e.g., the Z-axis direction) on one surface of the substrate SUB on which the circuit layer PCL is formed.

The first bank BNK1 may have various shapes according to one or more embodiments. In one or more embodiments, the first bank BNK1 may be formed to have an inclined surface inclined at an angle of a suitable range (e.g., a predetermined range) with respect to the substrate SUB. In one or more embodiments, the first bank BNK1 may have a cross-section of a semi-circle shape, a semi-ellipse shape, or the like, but is not limited thereto.

The first bank BNK1 may include an insulating material including at least one inorganic material and/or organic material. For example, the first bank BNK1 may include an inorganic layer of at least one layer including various inorganic insulating materials such as silicon nitride ($SiN_x$) or silicon oxide ($SiO_x$). Alternatively, the first bank BNK1 may include an organic layer of at least one layer, a photoresist layer, and/or the like including various types of organic insulating materials or may be configured of an insulator of a single layer or multiple layers including organic/inorganic materials in combination. That is, a configuration material and/or a pattern shape of the first bank BNK1 may be variously changed.

In one or more embodiments, the first bank BNK1 may function as a reflective member. For example, the first bank BNK1 may function as the reflective member that induces the light emitted from each light emitting element LD to a desired direction (for example, the third direction (e.g., the Z-axis direction)) together with the first and second electrodes ELT1 and ELT2 provided on the first bank BNK1 to improve the light emission efficiency of the pixel PXL. According to one or more embodiments, the first bank BNK1 may be omitted.

The first and second electrodes ELT1 and ELT2 configuring pixel electrodes of each pixel PXL may be disposed on the first bank BNK1. According to one or more embodiments, the first and second electrodes ELT1 and ELT2 may have a shape corresponding to the first bank BNK1. For example, the first and second electrodes ELT1 and ELT2 may protrude in the third direction (Z-axis direction) while having each inclined surface or curved surface corresponding to the first bank BNK1. In one or more embodiments, when the first bank BNK1 is not formed, the first and second electrodes ELT1 and ELT2 may be formed to be substantially flat on the passivation layer PSV, or may be formed to have different thicknesses for each area and thus one area may protrude in the third direction (Z-axis direction) of the substrate SUB.

Each of the first and second electrodes ELT1 and ELT2 may include at least one conductive material. For example, each of the first and second electrodes ELT1 and ELT2 may include at least one metal from among various metal materials including silver (Ag), magnesium (Mg), aluminum (Al), platinum (Pt), palladium (Pd), gold (Au), nickel (Ni), neodymium (Nd), iridium (Ir), chromium (Cr), titanium (Ti), molybdenum (Mo), copper (Cu), and the like, and an alloy thereof, a conductive oxide such as indium tin oxide (ITO), indium zinc oxide (IZO), indium tin zinc oxide (ITZO), zinc oxide (ZnO), aluminum doped zinc oxide (AZO), gallium doped zinc oxide (GZO), zinc tin oxide (ZTO), gallium tin oxide (GTO), and fluorine doped tin oxide (FTO), and a conductive polymer such as PEDOT, but is not limited thereto. For example, each of the first and second electrodes ELT1 and ELT2 may include other conductive materials such as carbon nanotube or graphene. That is, each of the first and second electrodes ELT1 and ELT2 may have conductivity by including at least one of various conductive materials, and a configuration material thereof is not particularly limited. In addition, the first and second electrodes ELT1 and ELT2 may include the same conductive material or different conductive materials.

A first insulating layer INS1 may be disposed on one area of the first electrode ELT1 and the second electrode ELT2. For example, the first insulating layer INS1 may be formed to cover one area of each of the first electrode ELT1 and the second electrode ELT2 and may include an opening exposing another area of each of the first electrode ELT1 and the second electrode ELT2. For example, the first insulating layer INS1 may expose one area of the first electrode ELT1 and the second electrode ELT2 on each first bank BNK1. According to one or more embodiments, the first insulating layer INS1 may be omitted.

In one or more embodiments, the first insulating layer INS1 may be formed to primarily cover the first electrode ELT1 and the second electrode ELT2 entirely. After the light emitting elements LD are supplied and aligned on the first insulating layer INS1, the first insulating layer INS1 may be partially opened to expose one area of each of the electrodes ELT1 and ELT2 in one area on each first bank BNK1. Alternatively, in one or more embodiments, the first insulating layer INS1 may be patterned in a form of an individual pattern that is locally disposed only under the light emitting elements LD, after the supply and the alignment of the light emitting elements LD are completed. The first insulating layer INS1 may be formed to cover the first electrode ELT1 and the second electrode ELT2 after the first electrode ELT1 and the second electrode ELT2 are formed, to prevent the first electrode ELT1 and the second electrode ELT2 from being damaged in a subsequent process. In addition, the first insulating layer INS1 may serve to stably support each light emitting element LD.

The first insulating layer INS1 may be configured as a single layer or multiple layers and may include at least one inorganic insulating material and/or organic insulating material. For example, the first insulating layer INS1 may include various types of currently known organic/inorganic insulating materials, including silicon nitride ($SiN_x$), silicon oxide ($SiO_x$), or aluminum oxide ($Al_2O_3$). A configuration material of the first insulating layer INS1 is not particularly limited.

The plurality of light emitting elements LD may be supplied and aligned on the first insulating layer INS1. For example, the plurality of light emitting elements LD may be supplied to the emission area of each pixel PXL through an inkjet method, a slit coating method, or various other methods, and the light emitting elements LD may be aligned while having directivity between the first electrode ELT1 and the second electrode ELT2 by a suitable alignment signal (e.g., a predetermined alignment signal or alignment voltage) applied to each of the first electrode ELT1 and the second electrode ELT2. In one or more embodiments, the light emitting elements LD may also be electrically connected to the first electrode ELT1 and the second electrode ELT2 through the contact electrodes CNE1 and CNE2.

The insulating pattern INP may be disposed on the light emitting elements LD. For example, the insulating pattern INP may be partially disposed on only one area including a central area of each of the light emitting elements LD while exposing one end and another end of the light emitting elements LD. The insulating pattern INP may be formed as an independent pattern. The insulating pattern INP may be configured as a single layer or multiple layers and may include at least one inorganic insulating material and/or organic insulating material. For example, the insulating pattern INP may include various types of currently known organic/inorganic insulating materials including silicon nitride ($SiN_x$), silicon oxide ($SiO_x$), aluminum oxide ($Al_2O_3$), and the like. When the insulating pattern INP is formed on the light emitting elements LD after the alignment of the light emitting elements LD is completed, the light emitting elements LD may be prevented from being separated from an aligned position. In addition, the insulating pattern INP may prevent the contact electrodes CNE1 and CNE2 from being short-circuited, thereby stably securing a contact between the light emitting element LD and the contact electrodes CNE1 and CNE2. For a detailed description thereof, FIG. 17 is referenced.

Referring to FIG. 17, one surface of the insulating pattern INP may include a concave-convex pattern PD. The concave-convex pattern PD may be formed by dry etching but is not necessarily limited thereto. In one or more embodiments, the concave-convex pattern PD may include a plurality of protrusion portions P1 and depression portions P2. The concave-convex pattern PD may have a shape in which a plurality of protrusion portions P1 and depression portions P2 are irregularly arranged. That is, as shown in FIG. 17, the plurality of protrusion portions P1 and depression portions P2 may be formed in various widths and heights. However, the present disclosure is not necessarily limited thereto, and the concave-convex pattern PD may have constant width and height.

A conductive material layer CL may be disposed in the depression portion P2 of the concave-convex pattern PD. The conductive material layer CL may be formed concurrently (e.g., simultaneously) with the contact electrodes CNE1 and CNE2 to be described later. That is, the conductive material layer CL may be formed of the same material as the contact electrodes CNE1 and CNE2. A thickness HC of the conductive material layer CL in the third direction (Z-axis direction) may be less than a thickness HP of the protrusion portion P1 in the third direction (e.g., the Z-axis direction). Here, the thickness HP of the protrusion portion P1 in the third direction (e.g., the Z-axis direction) may refer to an average thickness of the plurality of protrusion portions P1.

The contact electrodes CNE1 and CNE2 may be disposed on one side and another side of the insulating pattern INP. For example, the first contact electrode CNE1 and the second contact electrode CNE2 may be spaced from each other with the insulating pattern INP therebetween. The first contact electrode CNE1 may be disposed on the one side of the insulating pattern INP to contact the first electrode ELT1 and one end of the light emitting element LD. In addition, the second contact electrode CNE2 may be disposed on the other side of the insulating pattern INP to contact the second electrode ELT2 and another end of the light emitting element LD.

In one or more embodiments, the first contact electrode CNE1 and the second contact electrode CNE2 may be formed of the same conductive layer. That is, the first contact electrode CNE1 and the second contact electrode CNE2 may be concurrently (e.g., simultaneously) formed. In this case, because the number of masks may be reduced, a manufacturing process of the display device may be simplified. In addition, because forming a conductive layer on the protrusion portion P1 of the concave-convex pattern PD is difficult, the first contact electrode CNE1 and the second contact electrode CNE2 may be separated by the concave-convex pattern PD. Therefore, even though the first contact electrode CNE1 and the second contact electrode CNE2 are concurrently (e.g., simultaneously) formed, a short circuit between the first contact electrode CNE1 and the second contact electrode CNE2 may be prevented by the concave-convex pattern PD.

The first contact electrode CNE1 and the second contact electrode CNE2 may include the same material. According to one or more embodiments, the contact electrodes CNE1 and CNE2 may be formed of various transparent conductive materials. For example, the contact electrodes CNE1 and CNE2 may include at least one of various transparent conductive materials including ITO, IZO, and ITZO, and may be implemented to be substantially transparent or translucent to satisfy a desired light transmittance (e.g., a predetermined light transmittance).

A second insulating layer INS2 may be disposed on the insulating pattern INP and the contact electrodes CNE1 and CNE2. The second insulating layer INS2 may directly cover the concave-convex pattern PD and the contact electrodes CNE1 and CNE2 of the insulating pattern INP. That is, the second insulating layer INS2 may directly contact the concave-convex pattern PD of the insulating pattern INP and the contact electrodes CNE1 and CNE2. For example, the second insulating layer INS2 may be disposed on the entire surface of the substrate SUB. The second insulating layer INS2 may include at least one inorganic layer and/or organic layer. In one or more embodiments, the second insulating layer INS2 may include a thin film encapsulation layer of a multiple layer structure. For example, the second insulating layer INS2 may be configured as a thin film encapsulation layer of a multiple layer structure including inorganic insulating layers of at least two layers and an organic insulating layer of at least one layer interposed between the inorganic insulating layers of at least two layers but is not necessarily limited thereto.

According to one or more embodiments, an overcoat layer OC of at least one layer may be further disposed on the second insulating layer INS2. The overcoat layer OC may be configured as a single layer or multiple layers and may include at least one inorganic insulating material and/or organic insulating material. For example, each overcoat layer OC may include various types of currently known organic/inorganic insulating materials.

According to the display device according to the above-described embodiment, because the insulating pattern INP includes the concave-convex pattern PD, the first contact electrode CNE1 and the second contact electrode CNE2 may be prevented from being short-circuited, and thus process economics may be improved by concurrently (e.g., simultaneously) forming the first contact electrode CNE1 and the second contact electrode CNE2.

Hereinafter, a display device according to one or more embodiments of the present disclosure is described. In the following embodiment, the same configurations as those already described are referred to by the same reference numerals, and a duplicate description is omitted or simplified.

Figure 18:
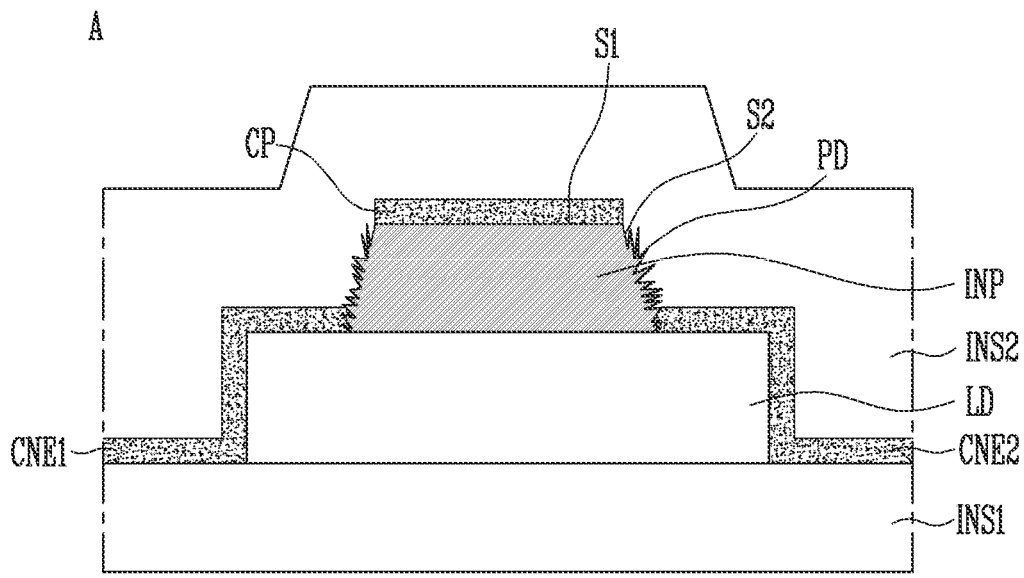
FIG. 18 is a cross-sectional view of a pixel according to one or more embodiments.

FIG. 18 is a cross-sectional view of a pixel according to one or more embodiments. FIG. 18 is a cross-sectional view corresponding the an area A of FIG. 15.

Referring to FIG. 18, a display device according to the present embodiment is different from the embodiment of FIGS. 1 to 17, in that the insulating pattern INP partially includes the concave-convex pattern PD.

Specifically, an upper surface S1 of the insulating pattern INP may not include the concave-convex pattern PD, and only a side surface S2 of the insulating pattern INP may partially include the concave-convex pattern PD. In this case, a surface roughness of the side surface S2 of the insulating pattern INP may be greater than a surface roughness of the upper surface S1 of the insulating pattern INP.

The first contact electrode CNE1 and the second contact electrode CNE2 may be concurrently (e.g., simultaneously) formed of the same conductive layer. In this case, because the number of masks may be reduced, the manufacturing process of the display device may be simplified as described above. In addition, the first contact electrode CNE1 and the second contact electrode CNE2 may be separated by the concave-convex pattern PD of the side surface S2 of the insulating pattern INP. Therefore, even though the first contact electrode CNE1 and the second contact electrode CNE2 are concurrently (e.g., simultaneously) formed, a short circuit of the first contact electrode CNE1 and the second contact electrode CNE2 may be prevented by the concave-convex pattern PD as described above.

A conductive pattern CP may be further disposed on the upper surface S1 of the insulating pattern INP. The conductive pattern CP may be disposed between the first contact electrode CNE1 and the second contact electrode CNE2. The conductive pattern CP may be formed concurrently (e.g., simultaneously) with the contact electrodes CNE1 and CNE2. That is, a thickness of the conductive pattern CP in the third direction (Z-axis direction) may be substantially the same as a thickness of the contact electrodes CNE1 and CNE2 in the third direction (e.g., the Z-axis direction). In addition, the conductive pattern CP may be formed of the same material as the contact electrodes CNE1 and CNE2. The conductive pattern CP may be floated by the concave-convex pattern PD of the side surface S2 of the insulating pattern INP. That is, the conductive pattern CP may be electrically separated from the first contact electrode CNE1 and the second contact electrode CNE2.

The second insulating layer INS2 may be disposed on the insulating pattern INP, the contact electrodes CNE1 and CNE2, and the conductive pattern CP. The second insulating layer INS2 may directly cover the side surface S2 of the insulating pattern INP. That is, the second insulating layer INS2 may directly contact the concave-convex pattern PD of the side surface S2 of the insulating pattern INP. The conductive pattern CP may be interposed between the second insulating layer INS2 and the upper surface S1 of the insulating pattern INP, and thus the second insulating layer INS2 may not contact the upper surface S1 of the insulating pattern INP.

Subsequently, a method of manufacturing the display device according to the above-described embodiments is described.

FIGS. 19 to 24 are cross-sectional views for each process step of a method of manufacturing a display device according to one or more embodiments. Hereinafter, configurations substantially the same as those of FIGS. 1 to 17 are denoted by the same reference numerals, and detailed reference numerals are omitted.

Figure 19:
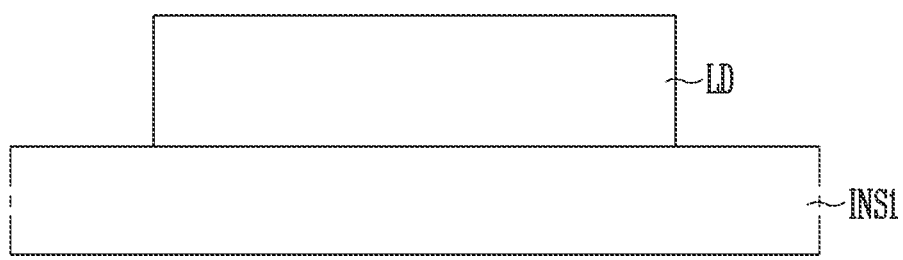
FIGS. 19 to 24 are cross-sectional views for each process step of a method of manufacturing a display device according to one or more embodiments.

Referring to FIG. 19, the light emitting element LD is supplied and aligned on the first insulating layer INS1. The light emitting element LD may be prepared in a dispersed form in a suitable solution (e.g., a predetermined solution), and may be supplied to the emission area of each pixel PXL through an inkjet printing method or the like. For example, the light emitting element LD may be mixed with a volatile solvent and dropped onto each emission area. At this time, when a suitable voltage (e.g., a predetermined voltage) is supplied through the above-described first and second electrodes ELT1 and ELT2, the light emitting elements LD may be aligned between the first and second electrodes ELT1 and ELT2 while an electric field is formed between the first and second electrodes ELT1 and ELT2. After the light emitting elements LD are aligned, the solvent may be evaporated or removed by other methods to stably arrange the light emitting elements LD between the first and second electrodes ELT1 and ELT2.

Figure 20:
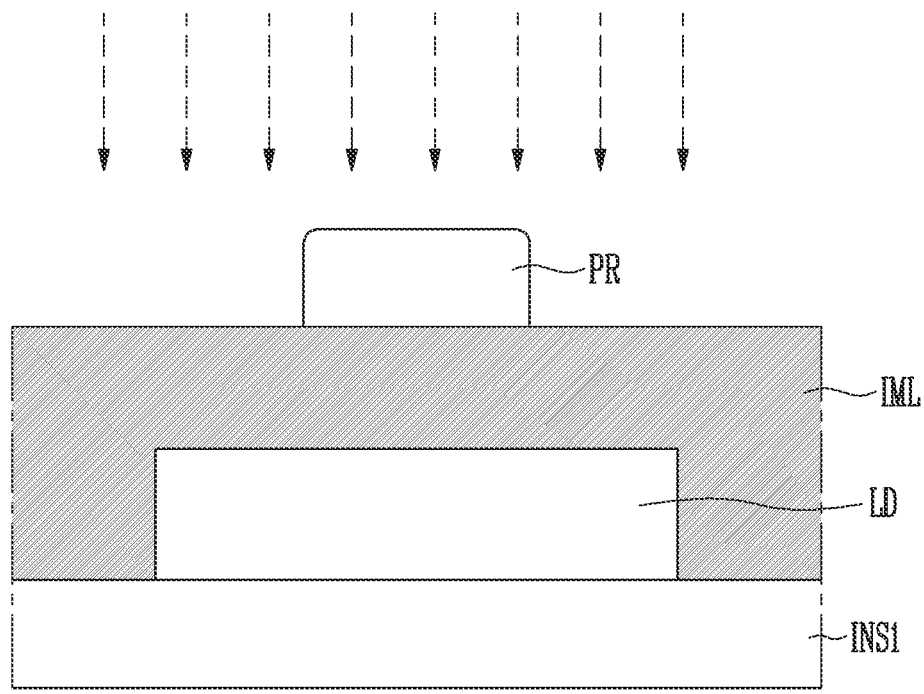

Referring to FIG. 20, subsequently, an insulating material layer IML is formed on the light emitting element LD. The insulating material layer IML may be formed of various types of currently known organic/inorganic insulating materials, including silicon nitride ($SiN_x$), silicon oxide ($SiO_x$), aluminum oxide ($Al_2O_3$), and the like. Subsequently, a photoresist pattern PR is formed on the insulating material layer IML, and then the insulating material layer IML is dry etched using the photoresist pattern PR as a barrier.

Figure 21:
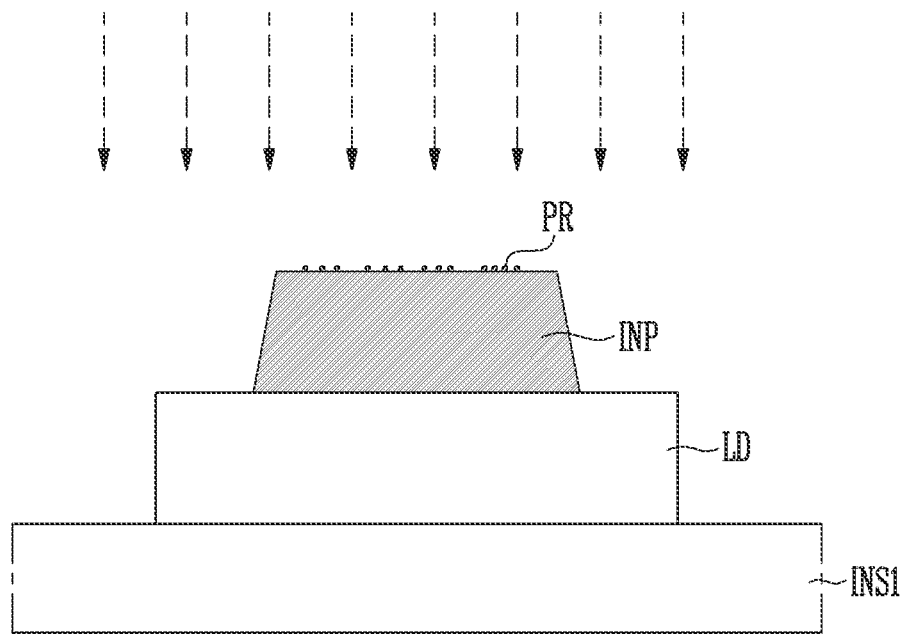
Figure 22:
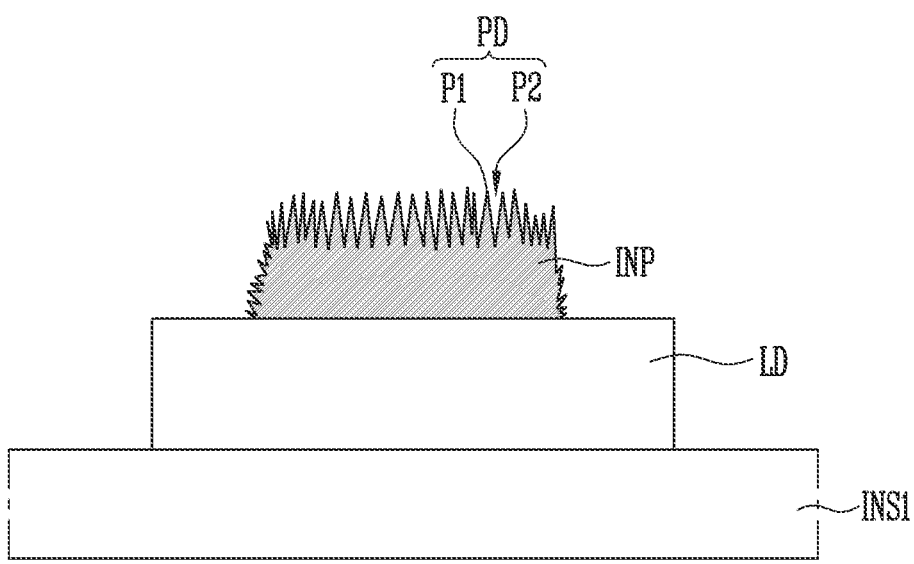

Referring to FIG. 21, the insulating pattern INP is formed by dry etching the insulating material layer IML. In this process, a small amount of a residual layer of the photoresist pattern PR may remain on the insulating pattern INP. In a state in which the small amount of the photoresist pattern PR exists on the insulating pattern INP, the insulating pattern INP may be additionally etched to form the concave-convex pattern PD as shown in FIG. 22. That is, the insulating pattern INP may be partially etched by the small amount of the photoresist pattern PR to form a plurality of protrusions P1 and depressions P2 may be formed. At this time, the concave-convex pattern PD may be easily formed on a surface of the insulating pattern INP by adjusting an etching process condition. For example, the concave-convex pattern PD may be more easily formed by reducing an oxygen flow rate in an etching gas within a range in which the small amount of the photoresist pattern PR may remain and shortening an etching time.

Figure 23:
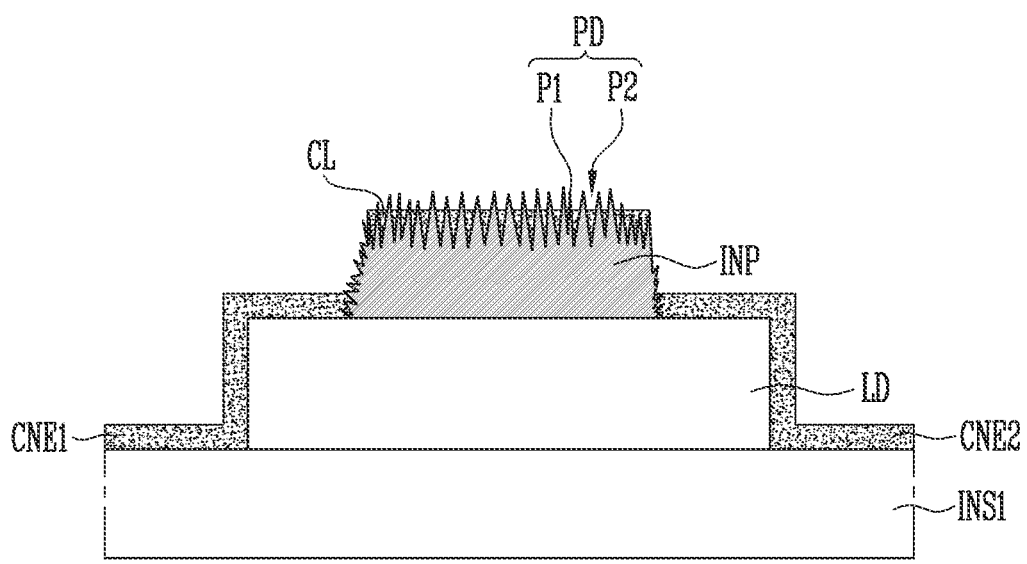

Referring to FIG. 23, the first contact electrode CNE1 and the second contact electrode CNE2 are concurrently (e.g., simultaneously) formed on the light emitting element LD. Accordingly, because the number of masks may be reduced, the manufacturing process of the display device may be simplified as described above. Because forming a conductive layer on the protrusion P1 of the concave-convex pattern PD is difficult, the first contact electrode CNE1 and the second contact electrode CNE2 may be separated. Therefore, even though the first contact electrode CNE1 and the second contact electrode CNE2 are concurrently (e.g., simultaneously) formed, the short circuit of the first contact electrode CNE1 and the second contact electrode CNE2 may be prevented by the concave-convex pattern PD as described above. According to one or more embodiments, in a process of forming the first contact electrode CNE1 and the second contact electrode CNE2, the conductive material layer CL may be further formed in the depression P2 of the concave-convex pattern PD described above.

Figure 24:
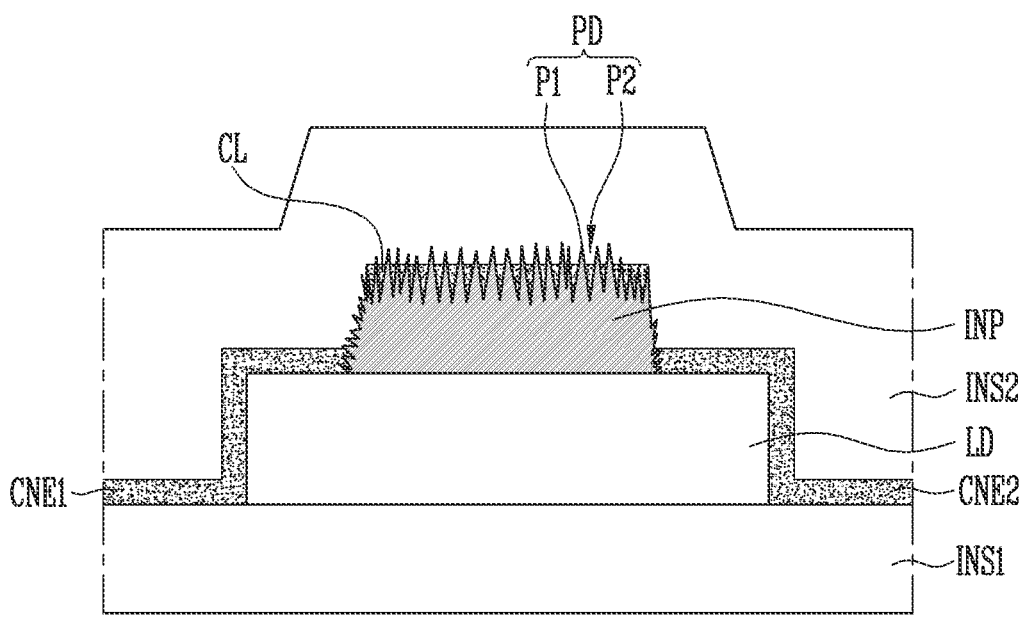

Referring to FIG. 24, subsequently the second insulating layer INS2 may be formed on the insulating pattern INP, the first contact electrode CNE1, and the second contact electrode CNE2, and thus the manufacture of the display device of FIG. 17 may be completed. The second insulating layer INS2 may be configured as a thin film encapsulation layer of a multiple layer structure including inorganic insulating layers of at least two layers and an organic insulating layer of at least one layer interposed between the inorganic insulating layers of at least two layers but is not necessarily limited thereto.

Those skilled in the art may understand that the present disclosure may be implemented in a modified form without departing from the above-described essential characteristic. Therefore, the disclosed methods should be considered in a description point of view not a limitation point of view. The scope is shown in the claims and their equivalents, and all differences within the scope will be construed as being included in the present disclosure.

The invention claimed is:

1. A display device comprising:
   a substrate;
   a first electrode and a second electrode on the substrate and spaced from each other;
   a light emitting element between the first electrode and the second electrode;
   an insulating pattern on the light emitting element;
   a first contact electrode on one side of the insulating pattern and contacting the first electrode and one end of the light emitting element; and
   a second contact electrode on another side of the insulating pattern and contacting the second electrode and an other end of the light emitting element,
   wherein a surface of the insulating pattern comprises a concave-convex pattern, and
   wherein a conductive material layer is in depression portions of the concave-convex pattern.

2. The display device according to claim 1, wherein the first contact electrode and the second contact electrode comprise same material.

3. The display device according to claim 1, wherein the insulating pattern exposes the one end of the light emitting element and the other end of the light emitting element.

4. The display device according to claim 1, wherein the first contact electrode and the second contact electrode are spaced from each other with the insulating pattern interposed therebetween.

5. The display device according to claim 1, further comprising an insulating layer covering the first contact electrode and the second contact electrode.

6. The display device according to claim 5, wherein the insulating layer covers the concave-convex pattern.

7. The display device according to claim 1, wherein the concave-convex pattern has a plurality of protrusion portions and the depression portions.

8. The display device according to claim 7, wherein the conductive material layer comprises same material as the first contact electrode and the second contact electrode.

9. The display device according to claim 7, wherein a thickness of the conductive material layer is less than a thickness of the protrusion portions.

10. A display device comprising:
    a substrate;
    a first electrode and a second electrode on the substrate and spaced from each other;
    a light emitting element between the first electrode and the second electrode;
    an insulating pattern on the light emitting element;
    a first contact electrode on one side of the insulating pattern and contacting the first electrode and one end of the light emitting element; and
    a second contact electrode on another side of the insulating pattern and contacting the second electrode and an other end of the light emitting element,
    wherein a surface of the insulating pattern comprises a concave-convex pattern, and
    wherein a surface roughness of a side surface of the insulating pattern is greater than a surface roughness of an upper surface of the insulating pattern.

11. The display device according to claim 10, further comprising
    a conductive pattern on the upper surface of the insulating pattern.

12. The display device according to claim 11, wherein the conductive pattern is located between the first contact electrode and the second contact electrode.

13. The display device according to claim 11, wherein the conductive pattern is electrically separated from the first contact electrode and the second contact electrode.

14. The display device according to claim 11, wherein the conductive pattern comprises same material as the first contact electrode and the second contact electrode.

15. The display device according to claim 11, wherein a thickness of the conductive pattern is substantially same as a thickness of the first contact electrode and the second contact electrode.

16. The display device according to claim 15, further comprising
    an insulating layer on the first contact electrode and the second contact electrode.

17. The display device according to claim 16, wherein the insulating layer covers the side surface of the insulating pattern.

18. The display device according to claim 16, wherein the insulating layer is not in contact with the upper surface of the insulating pattern.

19. The display device according to claim 16,
    wherein the conductive pattern is between the upper surface of the insulating pattern and the insulating layer.

* * * * *